US012133381B2

(12) United States Patent
Choi et al.

(10) Patent No.: US 12,133,381 B2
(45) Date of Patent: Oct. 29, 2024

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Moorym Choi, Yongin-si (KR); Taemok Gwon, Seoul (KR); Junhyoung Kim, Seoul (KR); Hyunjae Kim, Hwaseong-si (KR); Youngbum Woo, Hwaseong-si (KR); Jongin Yun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 487 days.

(21) Appl. No.: 17/497,200

(22) Filed: Oct. 8, 2021

(65) Prior Publication Data

US 2022/0216226 A1    Jul. 7, 2022

(30) Foreign Application Priority Data

Jan. 4, 2021    (KR) ........................ 10-2021-0000278

(51) Int. Cl.
*H10B 41/27* (2023.01)
*G11C 5/06* (2006.01)
*H01L 23/538* (2006.01)
*H01L 29/06* (2006.01)
*H10B 43/27* (2023.01)

(52) U.S. Cl.
CPC .............. *H10B 41/27* (2023.02); *G11C 5/06* (2013.01); *H01L 23/5384* (2013.01); *H01L 23/5386* (2013.01); *H01L 29/0649* (2013.01); *H10B 43/27* (2023.02)

(58) Field of Classification Search
None
See application file for complete search history.

(56) References Cited

U.S. PATENT DOCUMENTS

| 9,431,415 | B2 | 8/2016 | Shin et al. |
| 9,666,289 | B2 | 5/2017 | Lee et al. |
| 9,728,549 | B2* | 8/2017 | Yun .......................... H10B 43/50 |
| 10,580,787 | B2 | 3/2020 | Nishikawa et al. |
| 10,741,247 | B1 | 8/2020 | Yeh et al. |

(Continued)

*Primary Examiner* — Bo B Jang
(74) *Attorney, Agent, or Firm* — HARNESS, DICKEY & PIERCE, P.L.C.

(57) ABSTRACT

A semiconductor device includes a first substrate including an impurity region including impurities of a first conductivity type, circuit devices on the first substrate, a lower interconnection structure electrically connected to the circuit devices, a second substrate on the lower interconnection structure and including semiconductor of the first conductivity type, gate electrodes on the second substrate and stacked and spaced apart from each other in a first direction perpendicular to an upper surface of the second substrate, channel structures penetrating the gate electrodes, and a connection structure. The channel structures may extend perpendicular to the second substrate. The channel structures may include a channel layer. The connection structure may connect the impurity region of the first substrate to the second substrate, and the connection structure may include a via including a semiconductor of a second conductivity type.

20 Claims, 22 Drawing Sheets

(56) References Cited

U.S. PATENT DOCUMENTS

| | | |
|---|---|---|
| 2014/0141610 A1 | 5/2014 | Jin et al. |
| 2015/0221666 A1* | 8/2015 | Lee .................. H01L 29/66833 |
| | | 257/329 |
| 2019/0139968 A1 | 5/2019 | Shim et al. |
| 2020/0098776 A1 | 3/2020 | Sugisaki |
| 2021/0296236 A1* | 9/2021 | Shirai .................... H10B 43/35 |

* cited by examiner

SEMICONDUCTOR DEVICES AND DATA STORAGE SYSTEMS INCLUDING THE SAME

CROSS TO REFERENCE TO RELATED APPLICATION(S)

This application claims benefit of priority to Korean Patent Application No. 10-2021-0000278, filed on Jan. 4, 2021 in the Korean Intellectual Property Office, the disclosure of which is incorporated herein by reference in its entirety.

BACKGROUND

Example embodiments of the present disclosure relate to a semiconductor device and/or a data storage system including the same.

There has been demand for a semiconductor device that may store high-capacity data in a data storage system requiring data storage. Accordingly, a measure for increasing data storage capacity of a semiconductor device has been studied. For example, as one method of increasing data storage capacity of a semiconductor device, a semiconductor device including memory cells arranged three-dimensionally, instead of memory cells arranged two-dimensionally, has been suggested.

SUMMARY

An example embodiment of the present disclosure provides a semiconductor device having improved reliability.

An example embodiment of the present disclosure provides a data storage system including a semiconductor device having improved reliability.

According to an example embodiment of the present disclosure, a semiconductor device may include a first semiconductor structure and a second semiconductor structure. The first semiconductor structure may include a first substrate, circuit devices on the first substrate, a lower interconnection structure electrically connected to the circuit devices, and a connection structure. The first substrate may include an impurity region including impurities of a first conductivity type. The connection structure may include a via including a semiconductor of a second conductivity type. The second semiconductor structure may include a second substrate on the first semiconductor structure, gate electrodes stacked and spaced apart from each other in a first direction perpendicular to an upper surface of the second substrate, and channel structures penetrating the gate electrodes. The second substrate may include a semiconductor of the first conductivity type. The channel structures may extend perpendicular to the upper surface of the second substrate. The channel structures each may include a channel layer. The second semiconductor structure may be connected to the impurity region of the first substrate through the connection structure.

According to an example embodiment of the present disclosure, a semiconductor device may include a first substrate including an impurity region, circuit devices on the first substrate, a lower interconnection structure electrically connected to the circuit devices, a second substrate on the lower interconnection structure and including a semiconductor of a first conductivity type, gate electrodes on the second substrate and stacked and spaced apart from each other in a direction perpendicular to an upper surface of the second substrate, channel structures penetrating the gate electrodes and extending perpendicular to the second substrate, and a connection structure connecting the impurity region of the first substrate to the second substrate. The channel structures may each include a channel layer. The connection structure may include a via. The via may include a semiconductor of a second conductivity type that is different from the first conductivity type.

According to an example embodiment of the present disclosure, a data storage system may include a semiconductor storage device and a controller. The semiconductor storage device may include a first substrate including an impurity region, circuit devices on the first substrate, a lower interconnection structure electrically connected to the circuit devices, a second substrate on the lower interconnection structure, gate electrodes on the second substrate, channel structures penetrating the gate electrodes, a connection structure connecting the impurity region of the first substrate to the second substrate, and an input and output pad electrically connected to the circuit devices. The second substrate may include a semiconductor of a first conductivity type. The gate electrodes may be stacked and spaced apart from each other in a direction perpendicular to an upper surface of the second substrate. The channel structures may extend perpendicular to the second substrate. The channel structures each may include a channel layer. The connection structure may include a via. The via may include a semiconductor of a second conductivity type that may be different than a conductivity type of the second substrate. The controller may be electrically connected to the semiconductor storage device through the input and output pad. The controller may be configured to control the semiconductor storage device.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
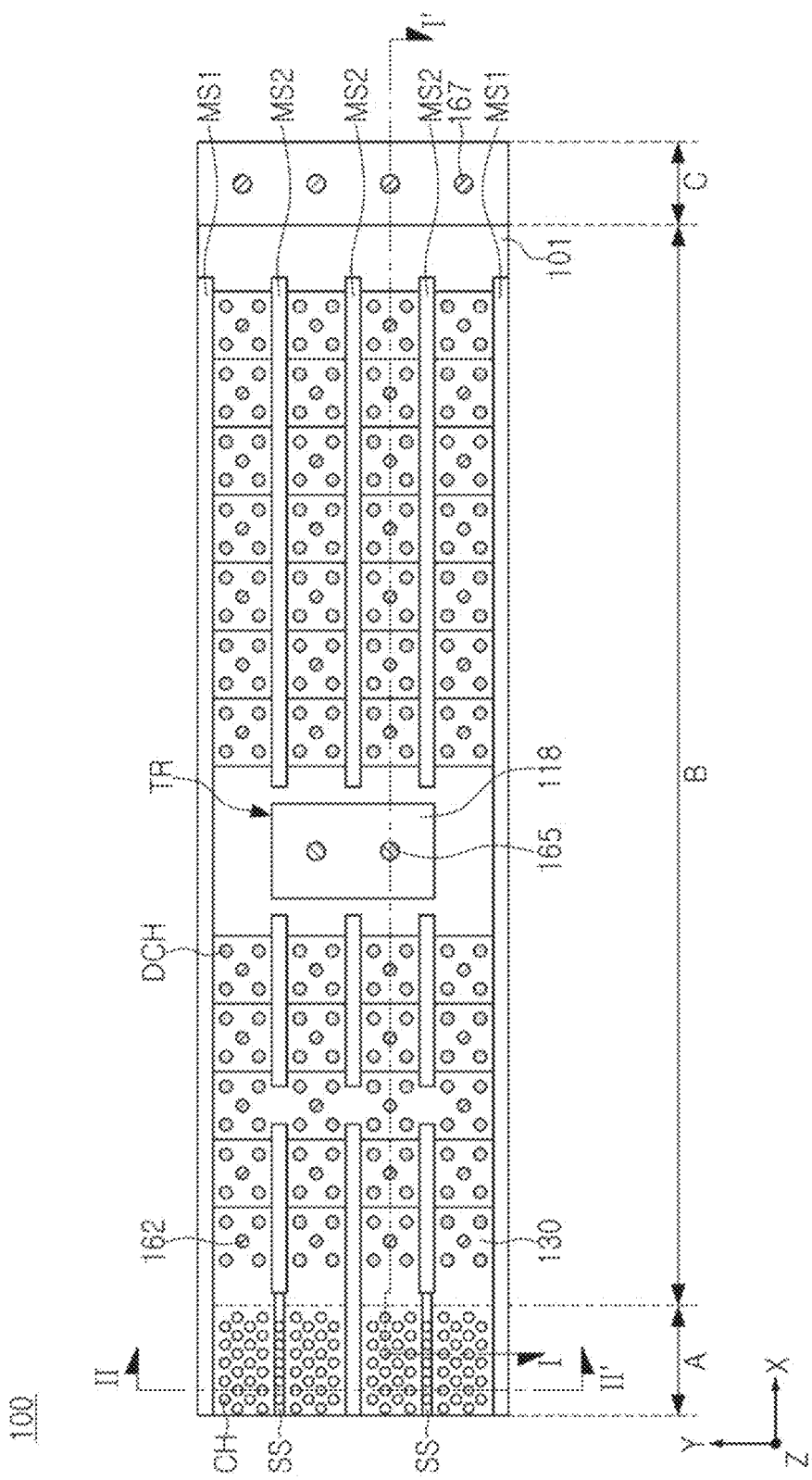
FIG. 1 is a plan view illustrating a semiconductor device according to an example embodiment of the present disclosure.

FIG. 1 is a plan view illustrating a semiconductor device according to an example embodiment.

Figure 2A:
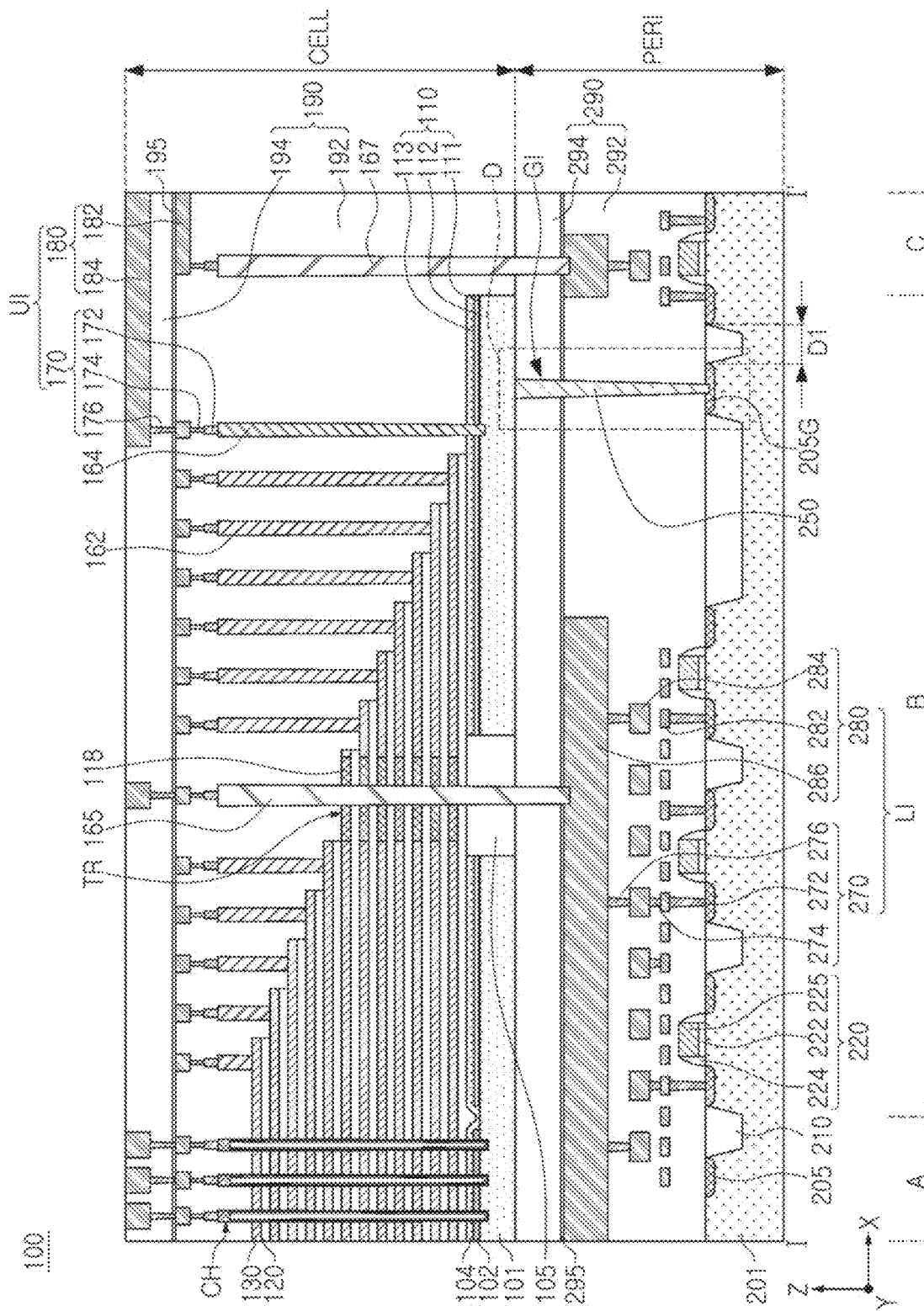
FIGS. 2A and 2B are cross-sectional views illustrating a semiconductor device according to an example embodiment of the present disclosure.
Figure 2B:
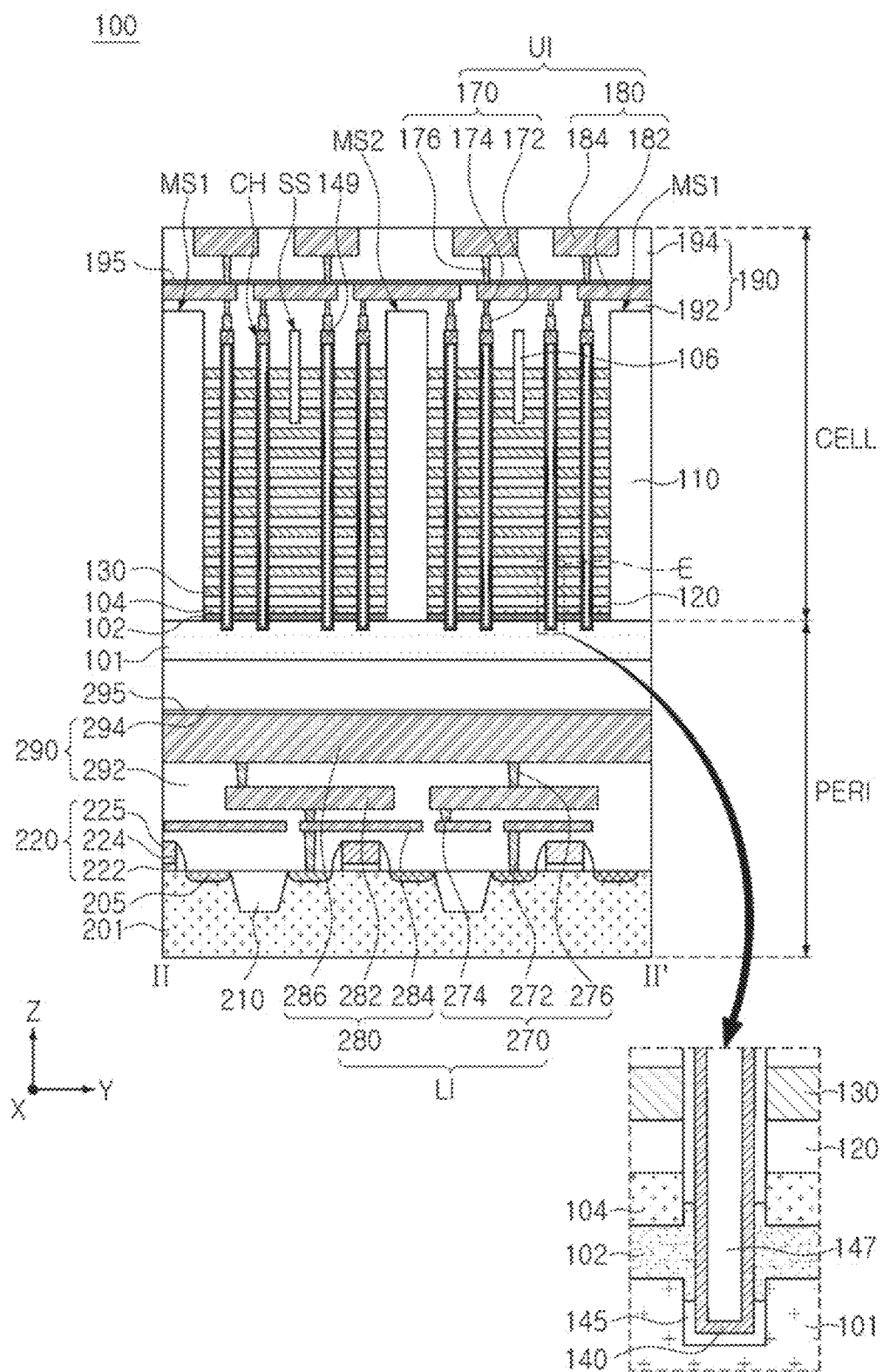

FIGS. 2A and 2B are cross-sectional views illustrating a semiconductor device according to an example embodiment, illustrating cross-sectional views taken along lines I-I' and II-II' in FIG. 1, respectively.

Figure 3:
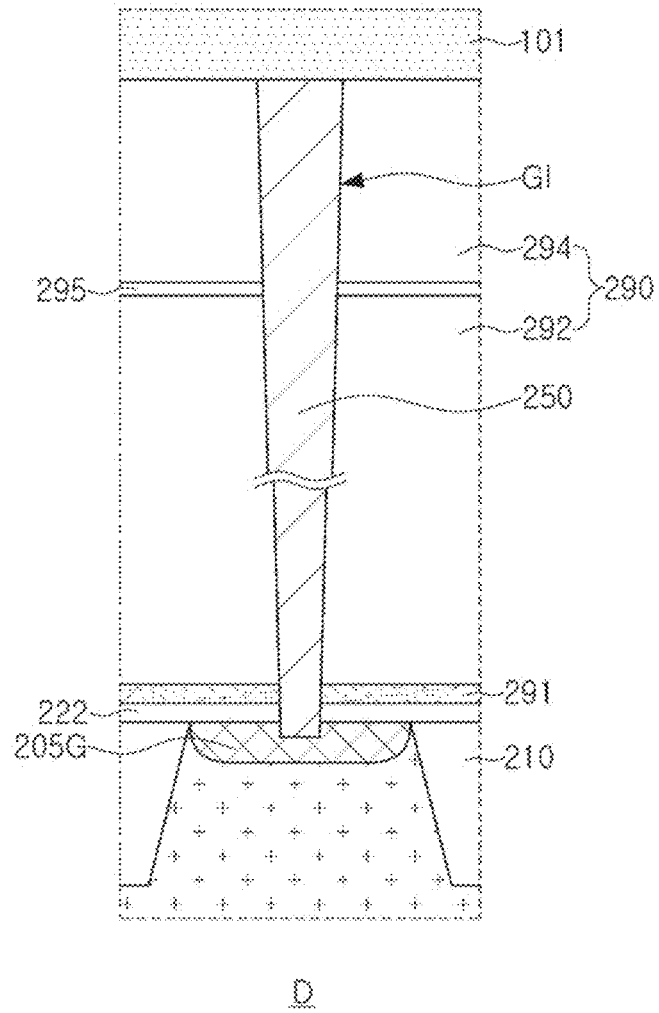
FIG. 3 is an enlarged view illustrating a portion of a semiconductor device according to an example embodiment of the present disclosure.

FIG. 3 is an enlarged view illustrating a portion of a semiconductor device according to an example embodiment, illustrating region "D" in FIG. 2A.

Referring to FIGS. 1 to 3, a semiconductor device 100 may include a peripheral circuit region PERI, which may be a first semiconductor structure including a first substrate 201, and a memory cell region CELL, which may be a second semiconductor structure including a second substrate 101. The memory cell region CELL may be disposed on an upper end of the peripheral circuit region PERI. In example embodiments, alternatively, the cell region CELL may be disposed on a lower end of the peripheral circuit region PERI.

The peripheral circuit region PERI may further include a connection structure GI connecting the first substrate 201 to the second substrate 101 and including a via 250. The memory cell region CELL may further include a through wiring region TR including a first through via 165 electrically connecting the peripheral circuit region PERI to the memory cell region CELL. The connection structure GI may be disposed to extend from a lower portion of the memory cell region CELL into the peripheral circuit region PERI. The through wiring region TR may be disposed to extend from the memory cell region CELL to an upper region of the peripheral circuit region PERI.

The peripheral circuit region PERI may include the first substrate 201, source/drain regions 205 and device isolation layers 210 in the first substrate 201, circuit devices 220 disposed on the first substrate 201, a peripheral region insulating layer 290, a lower protective layer 295, a first interconnection structure LI, and a connection structure GI.

The first substrate 201 may have an upper surface extending in the x direction and the y direction. An active region may be defined by the device isolation layers 210 on the first substrate 201. The source/drain regions 205 and the impurity regions 205G including impurities may be disposed in a portion of the active region. The first substrate 201 may include a semiconductor material, such as a group IV semiconductor, a group III-V compound semiconductor, or a group II-VI compound semiconductor. The source/drain regions 205 and the impurity region 205G may include, for example, N-type impurities. The first substrate 201 may include impurities, such as P-type impurities, for example, in a region other than the source/drain regions 205 and the impurity region 205G. The first substrate 201 may be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 in both sides of the circuit gate electrode 225.

The peripheral region insulating layer 290 may be disposed on the circuit device 220 on the first substrate 201. The peripheral region insulating layer 290 may include first and second peripheral region insulating layers 292 and 294, and each of the first and second peripheral region insulating layers 292 and 294 may also include a plurality of insulating layers. The peripheral region insulating layer 290 may be formed of an insulating material.

The lower protective layer 295 may be disposed on upper surfaces of the third lower interconnection lines 286 between the first and second peripheral region insulating layers 292 and 294. In example embodiments, the lower protective layer 295 may be further disposed on upper surfaces of the first and second lower interconnection lines 282 and 284. The lower protective layer 295 may be configured to limit and/or prevent contamination interconnection line caused by a metal material of the lower interconnection lines 280. The lower protective layer 295 may be formed of an insulating material different from that of the peripheral insulating layer 290, and may include, for example, silicon nitride.

The first interconnection structure LI may be configured as a lower interconnection structure electrically connected to the circuit devices 220 and the source/drain regions 205. The first interconnection structure LI may include lower contact plugs 270 having a cylindrical shape and lower interconnection lines 280 having a linear shape. The lower contact plugs 270 may include first to third lower contact plugs 272, 274, and 276. The first lower contact plugs 272 may be disposed on the circuit devices 220 and the source/drain regions 205, the second lower contact plugs 274 may be disposed on the first lower interconnection lines 282, and the third lower contact plugs 276 may be disposed on the second lower interconnection lines 284. The lower interconnection lines 280 may include first to third lower interconnection lines 282, 284, and 286. The first lower interconnection lines 282 may be disposed on the first lower contact plugs 272, the second lower interconnection lines 284 may be disposed on the second lower contact plugs 274, and the third lower interconnection lines 286 may be disposed on the third lower contact plugs 276. The first interconnection structure LI may include a conductive material, such as tungsten (W), copper (Cu), aluminum (Al), and the like, for example, and each of the components may further include a diffusion barrier. However, in example embodiments, the number of layers and the arrangement forms of the lower contact plugs 270 and the lower interconnection lines 280 included in the first interconnection structure LI may be varied.

The connection structure GI may be disposed in the peripheral circuit region PERI to connect the first substrate 201 to the second substrate 101. The connection structure GI may perform a function of grounding the second substrate 101 and the second horizontal conductive layer 104 during a process of manufacturing the semiconductor device 100, thereby limited and/or preventing arcing. Although only partially illustrated in FIG. 2A, a plurality of the connection structures GI may be disposed in the semiconductor device 100 and may be spaced apart from each other with desired and/or alternatively predetermined gaps in the y direction, for example. The connection structure GI may be disposed below the second region B of the second substrate 101. The connection structure GI may be disposed on an external side of ends of the gate electrodes 130 taken in the x direction, but an example embodiment thereof is not limited thereto. The connection structure GI may be disposed to be spaced apart from an adjacent region among the active regions in which the circuit devices 220 of the peripheral circuit region PERI are disposed by a minimum spacing distance D1.

The connection structure GI may include a via 250 as a bypass via. The via 250 may directly connect the first substrate 201 to the second substrate 101. Specifically, the via 250 may directly connect the impurity region 205G of the first substrate 201 to the second substrate 101. The via 250 may penetrate the second peripheral region insulating layer 294, the lower protective layer 295, and the first peripheral region insulating layer 292 from an upper portion and may be directly connected to the impurity region 205G.

As illustrated in FIG. 3, the via 250 may be in contact with the lower surface of the second substrate 101 and may further penetrate an etch stop layer 291 and a circuit gate dielectric layer 222 in a lower portion. The circuit gate dielectric layer 222 may be configured to extend from the circuit devices 220, and the etch stop layer 291 may be formed on the circuit gate dielectric layer 222 and may be configured to perform an etch stop function when the first lower contact plugs 272 is formed. The impurity region 205G may be configured to include impurities of the same conductivity type and the same concentration as those of the source/drain regions 205 of at least a portion of the circuit devices 220. The impurity region 205G may be formed in the first substrate 201 in a region surrounded by the device isolation layers 210, but an example embodiment thereof is not limited thereto. The impurity region 205G may include a semiconductor having a conductivity type different from that of at least a region of the first substrate 201 which may be in contact therewith.

A diameter of the via 250 in an upper portion may be larger than a diameter in a lower portion, and for example, the via 250 may have a diameter in a range of about 100 nm to about 200 nm in a lower portion. The via 250 may be disposed to be recessed into the impurity region 205G by a desired and/or alternatively predetermined depth. The depth may be, for example, in a range of about 400 Å to about 900 Å, but an example embodiment thereof is not limited thereto.

The via 250 may include a semiconductor material, such as at least one of silicon (Si) and germanium (Ge), for example. The via 250 may be formed of a doped semiconductor material including impurities. The via 250 may include a semiconductor of a conductivity type different from that of the impurity region 205G and the second substrate 101. Specifically, the impurity region 205G and the second substrate 101 may include a first conductivity type semiconductor, and the via 250 may include a second conductivity type semiconductor. For example, the first conductivity type may be an N type, and the second conductivity type may be a P type. However, in example embodiments, the first conductivity type may be P-type and the second conductivity type may be N-type. Also, the first substrate 201 may have the second conductivity type at least in a region adjacent to the impurity region 205G, similarly to the via 250. Accordingly, an NPNP junction structure may be formed in the z direction from the second substrate 101.

The first substrate 201, the impurity region 205G, the via 250, and the second substrate 101 may include impurities or doping elements corresponding to respective conductivity types. For example, the first substrate 201 and the via 250 may include at least one of boron (B), aluminum (Al), gallium (Ga), and indium (In), which may be P-type dopants. The impurity region 205G and the second substrate 101 may include at least one of phosphorus (P), arsenic (As), and antimony (Sb), which may be N-type dopants.

The via 250 may include impurities of the second conductivity type in a concentration ranging from about $7.5 \times 10^{16}$ to about $2.5 \times 10^{17}$, about $1.0 \times 10^{17}$, for example. It has been confirmed through simulations and experiments that, when the impurity concentration is higher or lower than the above range in the via 250, breakdown occurred. Further, as a result of the above experiment, it has been confirmed that, when the impurity concentration of the via 250 is about $1.0 \times 10^{17}$, a breakdown voltage was about 30 V or more. The impurity region 205G and the second substrate 101 may include the first conductivity type impurities in a concentration higher than in the via 250. For example, the second substrate 101 may include the first conductivity type impurities in a concentration ranging from about $1.0 \times 10^{20}$ to about $5.0 \times 10^{20}$.

According to the junction structure of the via 250 and the regions connected to the via 250, a breakdown voltage may increase between the adjacent circuit device 220 and the impurity region 205G. For example, when an erase operation is performed on the memory cells of the memory cell region CELL in the semiconductor device 100, an erase voltage may be applied to the second substrate 101. The erase voltage may range from about 13 V to about 24 V, for example. Even when the erase voltage, a relatively high voltage, is applied, since the second substrate 101 and the via 250 form reverse-biased junction, the breakdown voltage may be secured by about 30 V or higher, for example, such that a leakage current may be limited and/or prevented.

Accordingly, the via 250 may reduce the minimum spacing distance D1 between the via 250 and the circuit devices 220 of the adjacent peripheral circuit region PERI. The minimum spacing distance D1 may be, for example, less than about 5 μm, and may be less than about 4 μm, for example. Also, even when the diameter of the via 250 is increased or the height of the via 250 is relatively high, such that the depth of the recess into the impurity region 205G is relatively large, a breakdown voltage may be secured such that a leakage current may be limited and/or prevented.

The memory cell region CELL may include a second substrate 101 having a first region A and a second region B, first and second horizontal conductive layers 102 and 104 on the second substrate, gate electrodes 130 stacked on the second substrate 101, first and second isolation regions MS1 and MS2 extending by penetrating the stack structure of the gate electrodes 130, upper isolation regions SS partially penetrating the stack structure, channel structures CH disposed to penetrate the stack structure, and a second interconnection structure UI electrically connected to the gate electrodes 130 and the channel structures CH. The memory cell region CELL may further include a substrate insulating layer 105, first to third horizontal sacrificial layers 111, 112, and 113 disposed in the second region B, interlayer insulating layers 120 alternately stacked with the gate electrodes 130 on the second substrate 101, gate contacts 162 connected to the gate electrodes 130, a substrate contact 164 connected to the second substrate 101, a cell region insulating layer 190 covering the gate electrodes 130, and an upper protective layer 195. The memory cell region CELL may further have a third region C disposed on an external side of the second substrate 101, and a through interconnection structure such as a second through via 167 connecting the memory cell region CELL to the peripheral circuit region PERI may be disposed in the third region C.

In the first region A of the second substrate 101, the gate electrodes 130 may be vertically stacked and the channel structures CH may be disposed, and memory cells may also be disposed in the first region A. In the second region B, the gate electrodes 130 may extend by different lengths, and the second region B may be configured to electrically connect the memory cells to the peripheral circuit region PERI. The second region B may be disposed on at least one end of the first region A in at least one direction, in the x direction, for example.

The second substrate 101 may have an upper surface extending in the x direction and the y direction. The second substrate 101 may include a semiconductor material, such as a group IV semiconductor, a group III-V compound semiconductor, or a group II-VI compound semiconductor, for example. For example, the group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer.

The first and second horizontal conductive layers 102 and 104 may be stacked on an upper surface of the second substrate 101 in the first region A. The first horizontal conductive layer 102 may function as a portion of a common source line of the semiconductor device 100, and may function as a common source line together with the second substrate 101, for example. As illustrated in the enlarged view in FIG. 2B, the first horizontal conductive layer 102 may be directly connected to the channel layer 140 around the channel layer 140. The first horizontal conductive layer 102 may not extend to the second region B, and the second horizontal conductive layer 104 may also be disposed in the second region B. The second horizontal conductive layer 104 may have substantially planar upper and lower surfaces in the first region A and the second region B.

The first and second horizontal conductive layers 102 and 104 may include a semiconductor material, such as polycrystalline silicon, for example. In this case, at least the first horizontal conductive layer 102 may be doped with impurities of the same conductivity type as that of the second substrate 101, and the second horizontal conductive layer 104 may be configured as a doped layer or may include impurities diffused from the first horizontal conductive layer 102. However, the material of the second horizontal conductive layer 104 is not limited to a semiconductor material, and may be replaced with an insulating layer.

The first to third horizontal sacrificial layers 111, 112, and 113 may be disposed on the second substrate 101 side by side with the first horizontal conductive layer 102 in a portion of the second region B. The first to third horizontal sacrificial layers 111, 112, and 113 may be stacked in order on the second substrate 101. The first to third horizontal sacrificial layers 111, 112, and 113 may be configured to remain after being partially replaced with the first horizontal conductive layer 102 in the process of manufacturing the semiconductor device 100. However, in example embodiments, the arrangement of the region of the second region B in which the first to third horizontal sacrificial layers 111, 112, and 113 remain may be varied.

The first and third horizontal sacrificial layers 111 and 113 and the second horizontal sacrificial layer 112 may include different insulating materials. The first and third horizontal sacrificial layers 111 and 113 may include the same material.

For example, the first and third horizontal sacrificial layers 111 and 113 may be formed of the same material as that of the interlayer insulating layers 120, and the second horizontal sacrificial layer 112 may be formed of the same material as that of the sacrificial insulating layers 118.

The substrate insulating layer 105 may be disposed in a region from which the second substrate 101, the first to third horizontal sacrificial layers 111, 112, and 113, and the second horizontal conductive layer 104 are partially removed on the second peripheral region insulating layer 294, and may be surrounded by the second substrate 101, the first to third horizontal sacrificial layers 111, 112, and 113, and the second horizontal conductive layer 104. The lower surface of the substrate insulating layer 105 may be coplanar with the lower surface of the second substrate 101 or may be disposed on a level lower than a level of the lower surface of the second substrate 101. In example embodiments, the substrate insulating layer 105 may include a plurality of layers stacked on the second peripheral region insulating layer 294. The substrate insulating layer 105 may be formed of an insulating material, and may include, for example, silicon oxide, silicon oxynitride, or silicon nitride.

The gate electrodes 130 may be vertically stacked and spaced apart from each other on the second substrate 101 and may form a stack structure. The gate electrodes 130 may include electrodes forming a ground select transistor, memory cells, and a string select transistor in order from the second substrate 101. The number of the gate electrodes 130 forming the memory cells may be determined according to capacity of the semiconductor device 100. In example embodiments, the number of the gate electrodes 130 forming the string select transistor and the ground select transistor may be one or two or more, and the gate electrodes 130 may have the same or different structure as that of the gate electrodes 130 of the memory cells. Also, the gate electrodes 130 may further include gate electrode 130 disposed in an upper portion of the gate electrode 130 forming the string select transistor and in a lower portion of the gate electrode 130 forming the ground select transistor and forming an erasing transistor used for an erasing operation using a gate induced drain leakage (GIDL) phenomenon. Also, a portion of the gate electrodes 130, the gate electrodes 130 adjacent to the gate electrode 130 forming the string select transistor and the ground select transistor, for example, may be dummy gate electrodes.

The gate electrodes 130 may be stacked and spaced apart from each other perpendicularly to the first region A, and may extend from the first region A to the second region B by different lengths and may form a stepped structure in a staircase shape. As illustrated in FIG. 2A, the gate electrodes 130 may have a stepped structure in the x direction, and may be disposed to have a stepped structure in the y direction. By the stepped structure, the gate electrodes 130 may form a staircase form in which the upper gate electrodes 130 may extend further than the lower gate electrodes 130, and may provide ends exposed upwardly from the interlayer insulating layers 120. In example embodiments, the gate electrodes 130 may have an increased thickness on the ends.

The gate electrodes 130 may include a metal material, such as tungsten (W), for example. In example embodiments, the gate electrodes 130 may include polycrystalline silicon or a metal silicide material. In example embodiments, the gate electrodes 130 may further include a diffusion barrier layer, and for example, the diffusion barrier layer may include tungsten nitride (WN), tantalum nitride (TaN), titanium nitride (TiN), or a combination thereof.

The interlayer insulating layers 120 may be disposed between the gate electrodes 130. Similarly to the gate electrodes 130, the interlayer insulating layers 120 may be spaced apart from each other in a direction perpendicular to the upper surface of the second substrate 101 and may extend in the x direction. The interlayer insulating layers 120 may include an insulating material such as silicon oxide or silicon nitride.

The first and second isolation regions MS1 and MS2 may be disposed to penetrate the gate electrodes 130 and may extend in the x direction in the first region A and the second region B. As illustrated in FIG. 1, the first and second isolation regions MS1 and MS2 may be disposed parallel to each other. The first and second isolation regions MS1 and MS2 may penetrate the entire gate electrodes 130 stacked on the second substrate 101 and may be connected to the second substrate 101 as illustrated in FIG. 2B. The first isolation regions MS1 may extend as a single region along the first region A and the second region B, and the second isolation regions MS2 may extend only to a portion of the second region B or may be intermittently disposed in the first region A and the second region B. However, in example embodiments, the arrangement order and the arrangement gap of the first and second isolation regions MS1 and MS2 may be varied. An isolation insulating layer 110 may be disposed in the first and second isolation regions MS1 and MS2 as illustrated in FIG. 2B. In example embodiments, the isolation insulating layer 110 may have a shape in which a width thereof may decrease toward the second substrate 101 due to a high aspect ratio.

The upper isolation regions SS may extend in the x direction between the first isolation regions MS1 and the second isolation region MS2. The upper isolation regions SS may be disposed in a portion of the second region B and the first region to penetrate a portion of the gate electrodes 130 including the uppermost gate electrode 130 among the gate electrodes 130. As illustrated in FIG. 2B, the upper isolation regions SS may isolate three gate electrodes 130 from each other in the y direction. However, the number of gate electrodes 130 isolated by the upper isolation regions SS may be varied in example embodiments. The upper isolation regions SS may include an upper isolation insulating layer 106.

Each of the channel structures CH may form a single memory cell string, and the channel structures CH may be spaced apart from each other and may form rows and columns on the first region A. The channel structures CH may be disposed to form a grid pattern on the x-y plane or may be disposed in a zigzag pattern in one direction. The channel structures CH may have a columnar shape, and may have an inclined side surface of which a width may decrease toward the second substrate 101 depending on an aspect ratio. In example embodiments, the channel structures CH disposed on ends of the first region A adjacent to the second region B may be dummy channels which may not substantially form a memory cell string.

As illustrated in the enlarged view in FIG. 2B, a channel layer 140 may be disposed in the channel structures CH. In the channel structures CH, the channel layer 140 may be formed in an annular shape surrounding the channel filling insulating layer 147. Alternatively, the channel layer 140 may have a columnar shape such as a cylindrical shape or a prism shape without the channel filling insulating layer 147 in example embodiments. The channel layer 140 may be connected to the first horizontal conductive layer 102 in a lower portion. The channel layer 140 may include a semiconductor material such as polycrystalline silicon or single crystal silicon.

Channel pads 149 may be disposed on the channel layer 140 in the channel structures CH. The channel pads 149 may be disposed to cover the upper surface of the channel filling insulating layer 147 and to be electrically connected to the channel layer 140. The channel pads 149 may include, for example, doped polycrystalline silicon.

The gate dielectric layer 145 may be disposed between the gate electrodes 130 and the channel layer 140. Although not illustrated in detail, the gate dielectric layer 145 may include a tunneling layer, a charge storage layer, and a blocking layer stacked in order from the channel layer 140. The tunneling layer may tunnel electric charges to the charge storage layer, and may include, for example, silicon oxide ($SiO_2$), silicon nitride ($Si_3N_4$), silicon oxynitride (SiON), or a combination thereof. The charge storage layer may be configured as a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

The cell region insulating layer 190 may be disposed to cover the second substrate 101, the gate electrodes 130 on the second substrate 101, and the peripheral region insulating layer 290. The cell region insulating layer 190 may include first and second cell region insulating layers 192 and 194, and each of the first and second cell region insulating layers 192 and 194 may include a plurality of insulating layers. The cell region insulating layer 190 may be formed of an insulating material.

The upper protective layer 195 may be disposed on upper surfaces of the first upper interconnection lines 182 between the first and second cell region insulating layers 192 and 194. In example embodiments, the upper protective layer 195 may be further disposed on the upper surfaces of the second upper interconnection lines 184. The upper protective layer 195 may be configured to prevent contamination of the upper interconnection lines 180 disposed in a lower portion caused by a metal material. The upper protective layer 195 may be formed of an insulating material different from that of the cell region insulating layer 190, and may include, for example, silicon nitride.

The gate contacts 162 may be connected to the gate electrodes 130 in the second region B. The gate contacts 162 may be disposed to penetrate at least a portion of the first cell region insulating layer 192 and to be connected to each of the gate electrodes 130 exposed upwardly. The substrate contact 164 may be connected to the second substrate 101 on an end of the second region B. The substrate contact 164 may penetrate the second horizontal conductive layer 104 penetrating at least a portion of the first cell region insulating layer 192 and exposed upwardly, and the first to third horizontal sacrificial layers 111, 112, and 113 disposed in a lower portion thereof, and may be connected to the second substrate 101. The substrate contact 164 may apply an electrical signal to a common source line including the second substrate 101, for example.

The second interconnection structure UI may be configured as an interconnection structure electrically connected to the gate electrodes 130 and the channel structures CH. The second interconnection structure UI may include upper contact plugs 170 having a cylindrical shape and upper interconnection lines 180 having a linear shape. The upper contact plugs 170 may include first to third upper contact plugs 172, 174, and 176. The first upper contact plugs 172 may be disposed on the channel pads 149 and the gate contacts 162, the second upper contact plugs 174 may be disposed on the first upper contact plugs 172, and the third upper contact plugs 176 may be disposed on the first upper interconnection lines 182. The upper interconnection lines 180 may include first and second upper interconnection lines 182 and 184. The first upper interconnection lines 182 may be disposed on the second upper contact plugs 174, and the second upper interconnection lines 184 may be disposed on the third upper contact plugs 176. The second interconnection structure UI may include a conductive material, such as tungsten (W), copper (Cu), aluminum (Al), and the like, for example, and may further include a diffusion barrier layer. However, in example embodiments, the number of layers and the arrangement form of the upper contact plugs 170 and the upper interconnection lines 180 forming the second interconnection structure UI may be varied.

The through wiring region TR may include a through interconnection structure for electrically connecting the memory cell region CELL to the peripheral circuit region PERI. The through wiring region TR may include a first through via 165 penetrating the second substrate 101 from an upper portion of the memory cell region CELL and extending in the z direction, and a through insulating region surrounding the first through via 165. The through insulating region may include sacrificial insulating layers 118, interlayer insulating layers 120 disposed perpendicular to the sacrificial insulating layers 118, and a substrate insulating layer 105. In example embodiments, the size, the arrangement form, and the shape of the through wiring region TR may be varied. In FIG. 2A, the through wiring region TR may be disposed in the second region B, but an example embodiment thereof is not limited thereto, and the through wiring region TR may also be disposed in the first region A with a desired and/or alternatively predetermined gap. The through wiring region TR may be disposed to be spaced apart from the first and second isolation regions MS1 and MS2. For example, the through wiring region TR may be disposed in a center of a pair of first isolation regions MS1 adjacent to each other in the y direction. By the arrangement, the sacrificial insulating layers 118 may remain in the through wiring region TR.

The first through via 165 may partially penetrate the first cell region insulating layer 192, the through insulating region, the lower protective layer 295, and the second peripheral region insulating layer 294 from an upper portion, and may extend perpendicularly to the upper surface of the second substrate 101. An upper end of the first through via 165 may be connected to the second interconnection structure UI, and a lower end may be connected to the first interconnection structure LI. In example embodiments, the number, the arrangement form, and the shape of the first through vias 165 in a single through wiring region TR may be varied. The first through via 165 may include a conductive material, such as a metal material such as tungsten (W), copper (Cu), and aluminum (Al), for example.

The sacrificial insulating layers 118 may be disposed on the same level as a level of the gate electrodes 130 with the same thickness as that of the gate electrodes 130, and may be disposed such that side surfaces of the gate electrodes 130 may be in contact with the gate electrodes 130 on a boundary of the through wiring region TR. The sacrificial insulating layers 118 may be alternately stacked with the interlayer insulating layers 120 and may form the through insulating region. The sacrificial insulating layers 118 may be disposed to have the same or different width as that of the lower substrate insulating layer 105. The sacrificial insulating layers 118 may be formed of an insulating material different from that of the interlayer insulating layers 120, and may include, for example, silicon oxide, silicon nitride, or silicon oxynitride.

The second through via 167 may be disposed in the third region C of the memory cell region CELL, an external side region of the second substrate 101, and may extend to the peripheral circuit region PERI. The second through via 167 may be disposed to connect the second interconnection structure UI to the first interconnection structure LI similarly to the first through via 165 of the through wiring region TR. However, the second through via 167 may extend by penetrating only a portion of the first cell region insulating layer 192 and the second peripheral region insulating layer 294 from an upper portion. The second through via 167 may include a conductive material, and may include a metal material such as tungsten (W), copper (Cu), and aluminum (Al).

Figure 4:
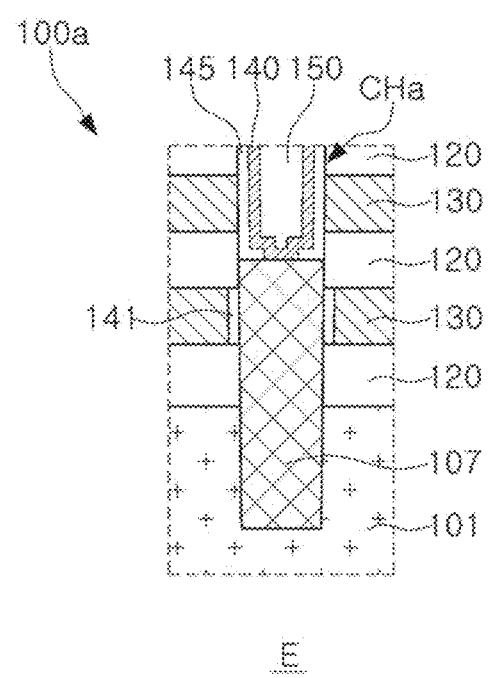
FIG. 4 is an enlarged view illustrating a portion of a semiconductor device according to an example embodiment of the present disclosure.

FIG. 4 is an enlarged view illustrating a portion of a semiconductor device according to an example embodiment, illustrating a region corresponding to region "E" in FIG. 2B.

Referring to FIG. 4, in a semiconductor device 100a, the memory cell region CELL may not include the first and second horizontal conductive layers 102 and 104 on the second substrate 101, differently from the example embodiments in FIGS. 2A and 2B. Also, the channel structure CHa may further include an epitaxial layer 107.

The epitaxial layer 107 may be disposed on the second substrate 101 in a lower portion of the channel structure CHa, and may be disposed on a side surface of at least one of the gate electrodes 130. The epitaxial layer 107 may be disposed in a recessed region of the second substrate 101. A height of a lower surface of the epitaxial layer 107 may be higher than an upper surface of the lowermost gate electrode 130 and may be lower than a lower surface of the gate electrode 130 in an upper portion thereof, but an example embodiment thereof is not limited thereto. The epitaxial layer 107 may be connected to the channel layer 140 through an upper surface. A gate insulating layer 141 may be further disposed between the epitaxial layer 107 and the gate electrode 130 in contact with the epitaxial layer 107.

Figure 5A:
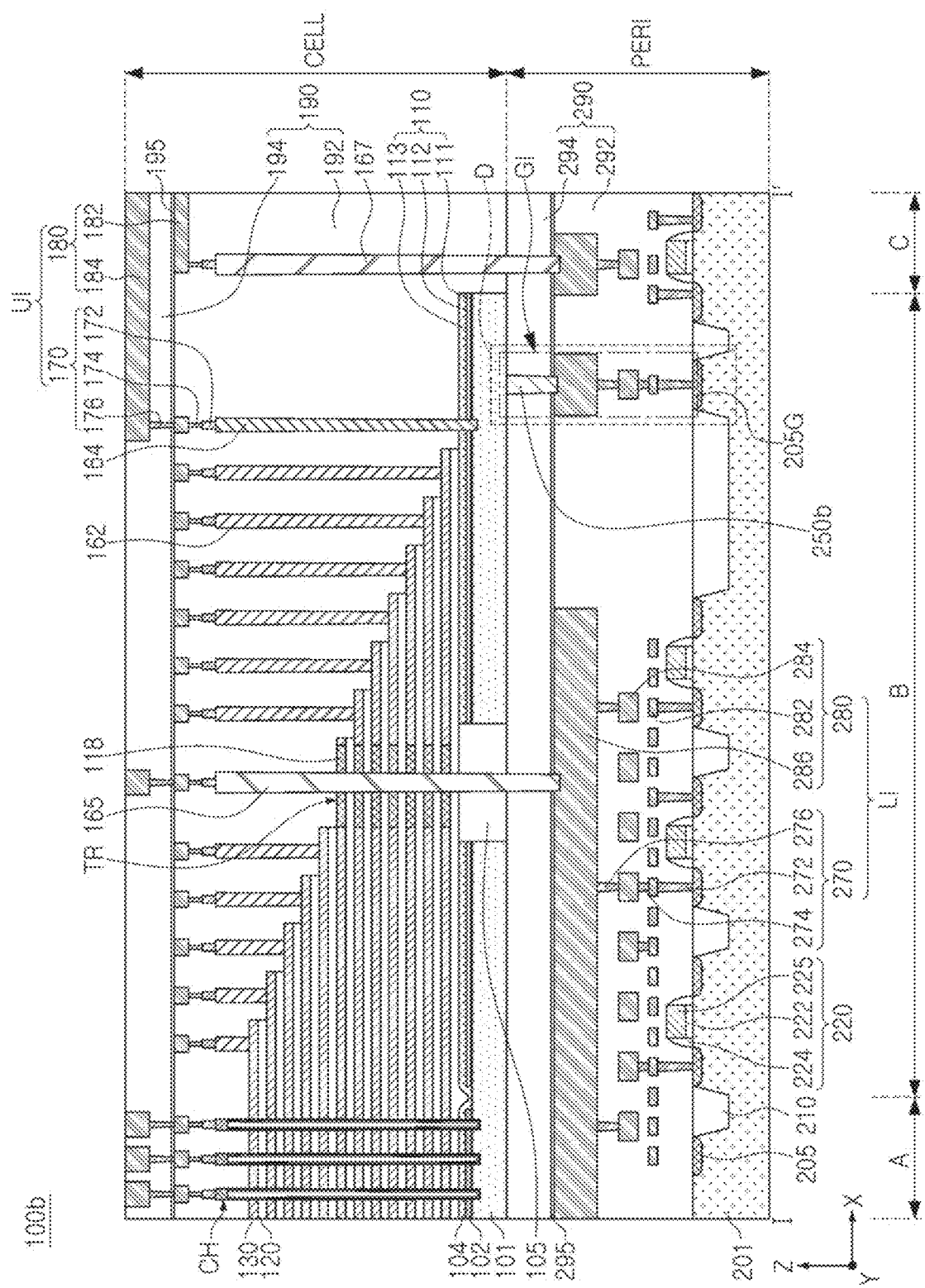
FIGS. 5A and 5B are a cross-sectional view illustrating a semiconductor device and an enlarged view illustrating a portion of a semiconductor device according to an example embodiment of the present disclosure.
Figure 5B:
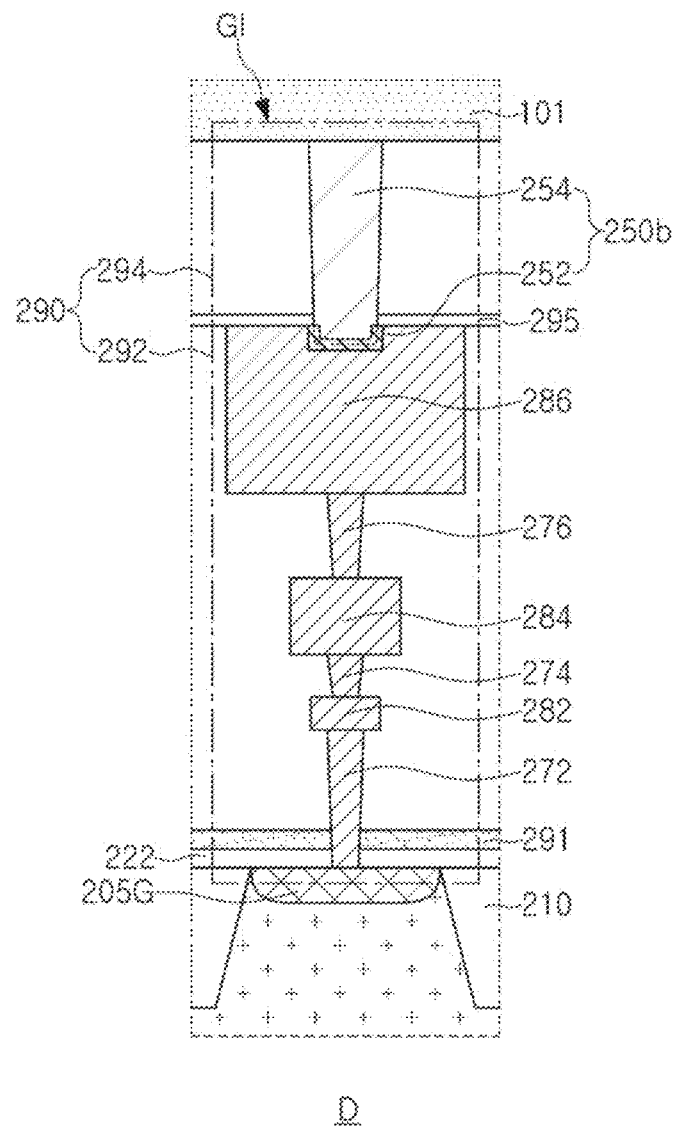

FIGS. 5A and 5B are a cross-sectional view and an enlarged view illustrating a semiconductor device according to an example embodiment, illustrating region "D" in FIG. 5A.

Referring to FIGS. 5A and 5B, a connection structure GI of a semiconductor device 100b may include a via 250b and a ground interconnection structure disposed in a lower portion of the via 250b. The ground interconnection structure may have a structure corresponding to the first interconnection structure LI.

The via 250b may include a barrier layer 252 covering a bottom surface of the via hole and a semiconductor layer 254 filling the via hole. The via 250b may be connected to the second substrate 101 through an upper surface. The semiconductor layer 254 may be in contact with the second substrate 101 in an upper surface of the via 250b. The barrier layer 252 may include metal nitride, and may include, for example, titanium nitride (TiN), titanium silicon nitride (TiSiN), tungsten nitride (WN), tantalum nitride (TaN), or a combination thereof. In example embodiments, the barrier layer 252 may extend onto a side surface of the via hole or may not be provided.

The semiconductor layer 254 may include a semiconductor material, and similarly to the via 250 described above with reference to FIGS. 1 to 3, the semiconductor layer 254 may include second conductivity type impurities different from that of the second substrate 101. Accordingly, the semiconductor layer 254 and the second substrate 101 may form NP junction from an upper portion, for example. Therefore, similarly to the via 250 in FIGS. 1 to 3, even when an erase voltage is applied, the second substrate 101 and the via 250b may form reverse bias junction, such that a breakdown voltage may be secured.

The ground interconnection structure may include components corresponding to the first interconnection structure LI, and may be electrically separated from the first interconnection structure LI. The ground interconnection structure may include first to third lower contact plugs 272, 274, and 276 and first to third lower interconnection lines 282, 284, and 286 spaced apart from the first interconnection structure LI. The via 250b may be partially recessed into an uppermost third lower interconnection line 286 and may be connected to the third lower interconnection line 286. However, in example embodiments, the via 250b may not be recessed into the third lower interconnection line 286 and may be in contact with the upper surface of the third lower interconnection line 286, and the recess depth may be varied. Similarly to the first interconnection structure LI, the ground interconnection structure may include a metal material.

Figure 6A:
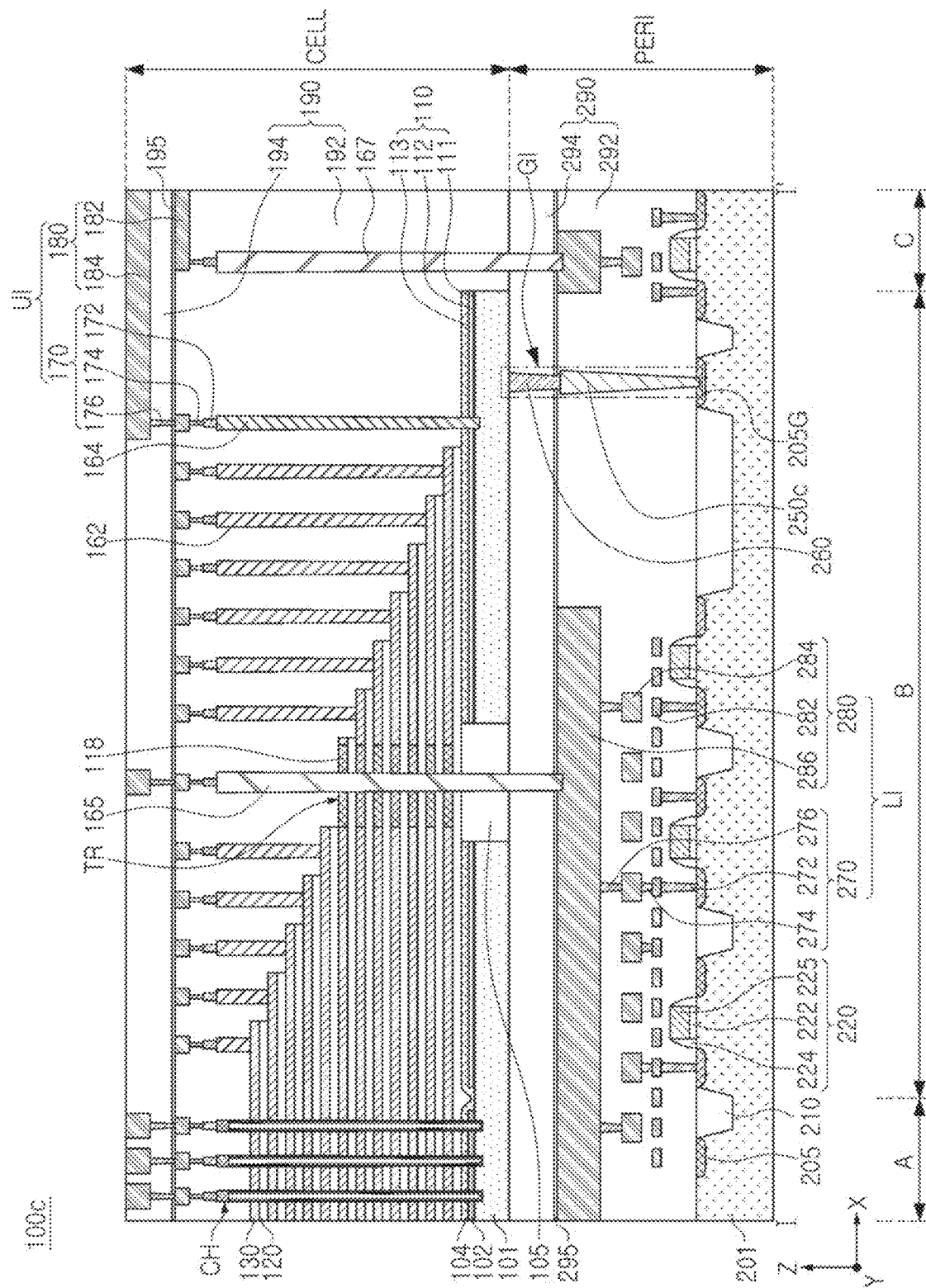
FIGS. 6A and 6B are cross-sectional views illustrating a semiconductor device according to an example embodiment of the present disclosure.
Figure 6B:
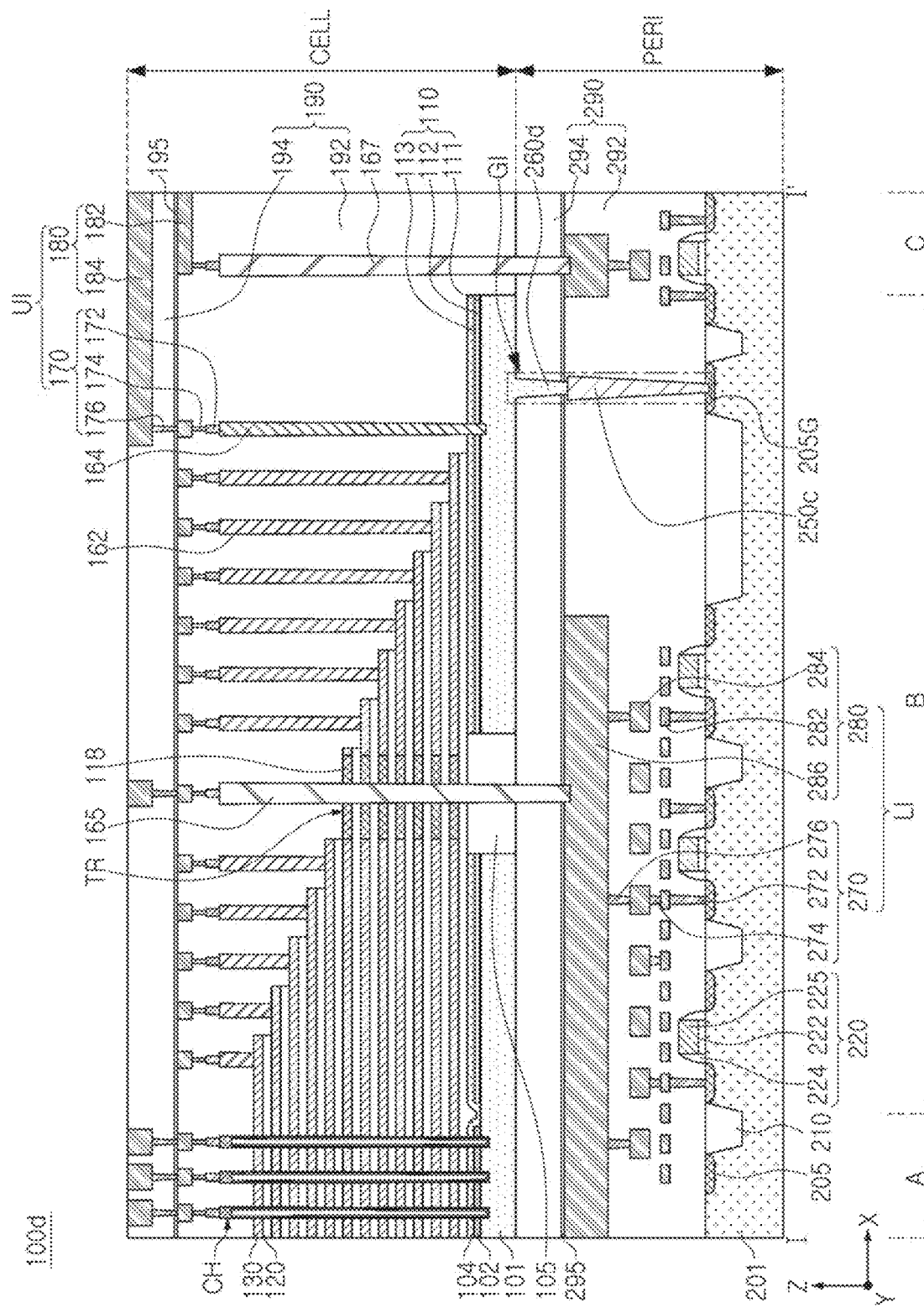

FIGS. 6A and 6B are cross-sectional views illustrating a semiconductor device according to an example embodiment.

Referring to FIG. 6A, a connection structure GI of a semiconductor device 100c may include a via 250c and an upper contact plug 260 disposed on the via 250c.

The upper contact plug 260 may be connected to a second substrate 101, and the via 250c may connect the upper contact plug 260 to an impurity region 205G. The via 250c is illustrated to have a length longer than that of the upper contact plug 260, but an example embodiment thereof is not limited thereto. In example embodiments, relative lengths of the upper contact plug 260 and the via 250c may be varied. Also, in example embodiments, a contact plug may be further disposed below the via 250c.

The upper contact plug 260 may be formed of a semiconductor material and may have a first conductivity type similarly to the second substrate 101. Accordingly, since the upper contact plug 260 and the via 250c have different conductivity types, the upper contact plug 260 and the via 250c may form NP junction from an upper portion, for example. Accordingly, similarly to the via 250 in FIGS. 1 to 3, even when an erase voltage is applied to the second substrate 101, the upper contact plug 260 and the via 250c may form reverse bias junction, such that a breakdown voltage may be secured.

Referring to FIG. 6B, a connection structure GI of a semiconductor device 100d may include a via 250c and an upper contact plug 260d, similarly to the example embodiment in FIG. 6A. However, differently from the example embodiment in FIG. 6A, the upper contact plug 260d may be configured to be integrated with the second substrate 101 and to extend from the second substrate 101. Accordingly, the upper contact plug 260d may have the same conductivity type as that of the second substrate 101 and may form NP junction with the via 250c.

Figure 7:
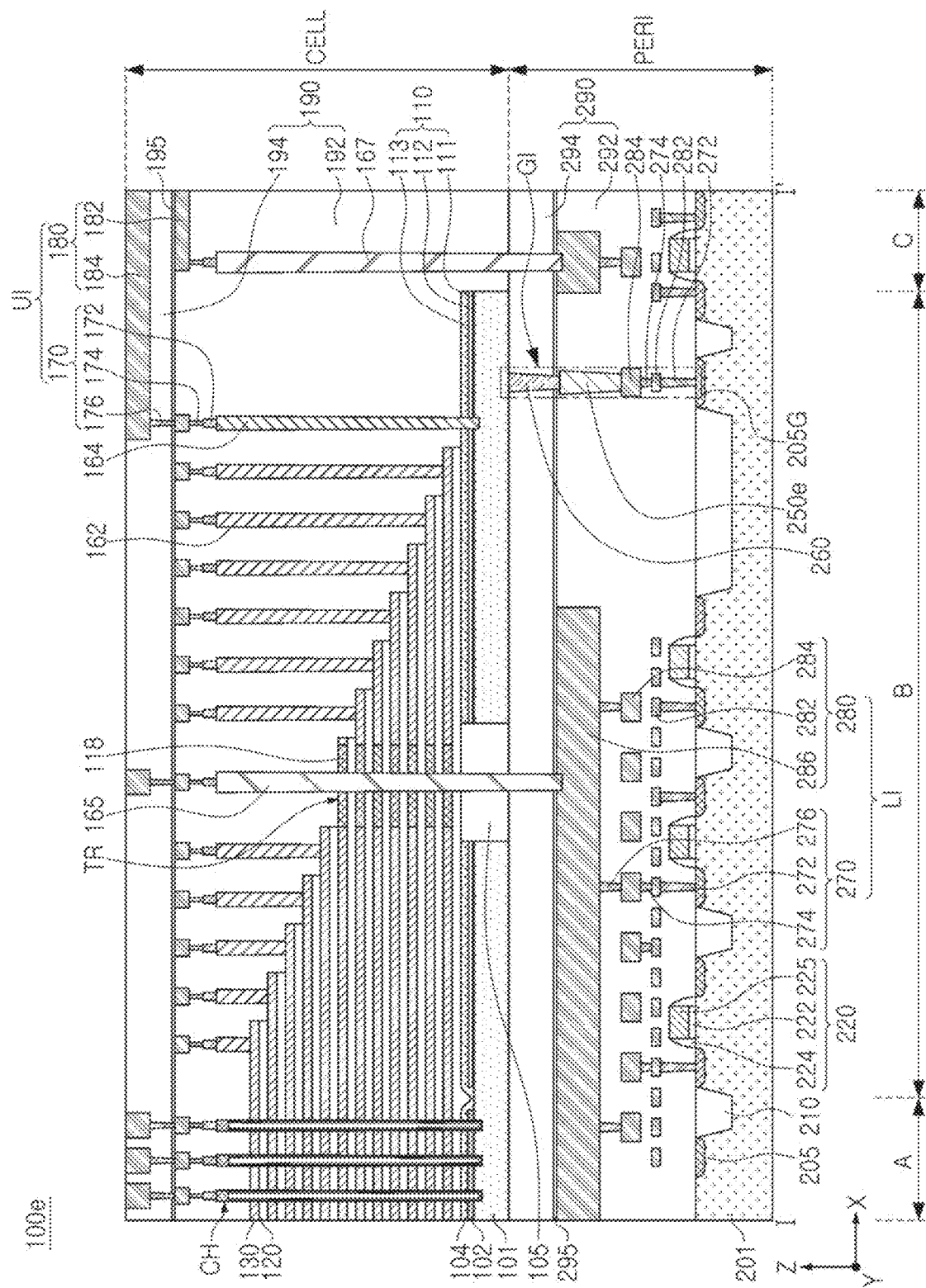
FIG. 7 is a cross-sectional view illustrating a semiconductor device according to an example embodiment of the present disclosure.

FIG. 7 is a cross-sectional view illustrating a semiconductor device according to an example embodiment.

Referring to FIG. 7, a connection structure GI of a semiconductor device 100e may include a via 250e, an upper contact plug 260 disposed in an upper portion of the via 250e, and a ground interconnection structure disposed below the via 250e. Differently from the example embodiment in FIG. 6A, the ground interconnection structure may be further included. As for the upper contact plug 260, the same description described above with reference to FIG. 6A may be applied, and the upper contact plug 260 and the via 250e may form NP junction.

The ground interconnection structure may include components corresponding to a portion of the first interconnection structure LI, and may be electrically separated from the first interconnection structure LI. The ground interconnection structure may include first and second lower contact plugs 272 and 274 and first and second lower interconnection lines 282 and 284, spaced apart from the first interconnection structure LI. In example embodiments, the number or the number of layers of the lower contact plugs 272, 274, and 276 and of the lower interconnection lines 282, 284, and 286, included in the ground interconnection structure, may be varied.

Figure 8:
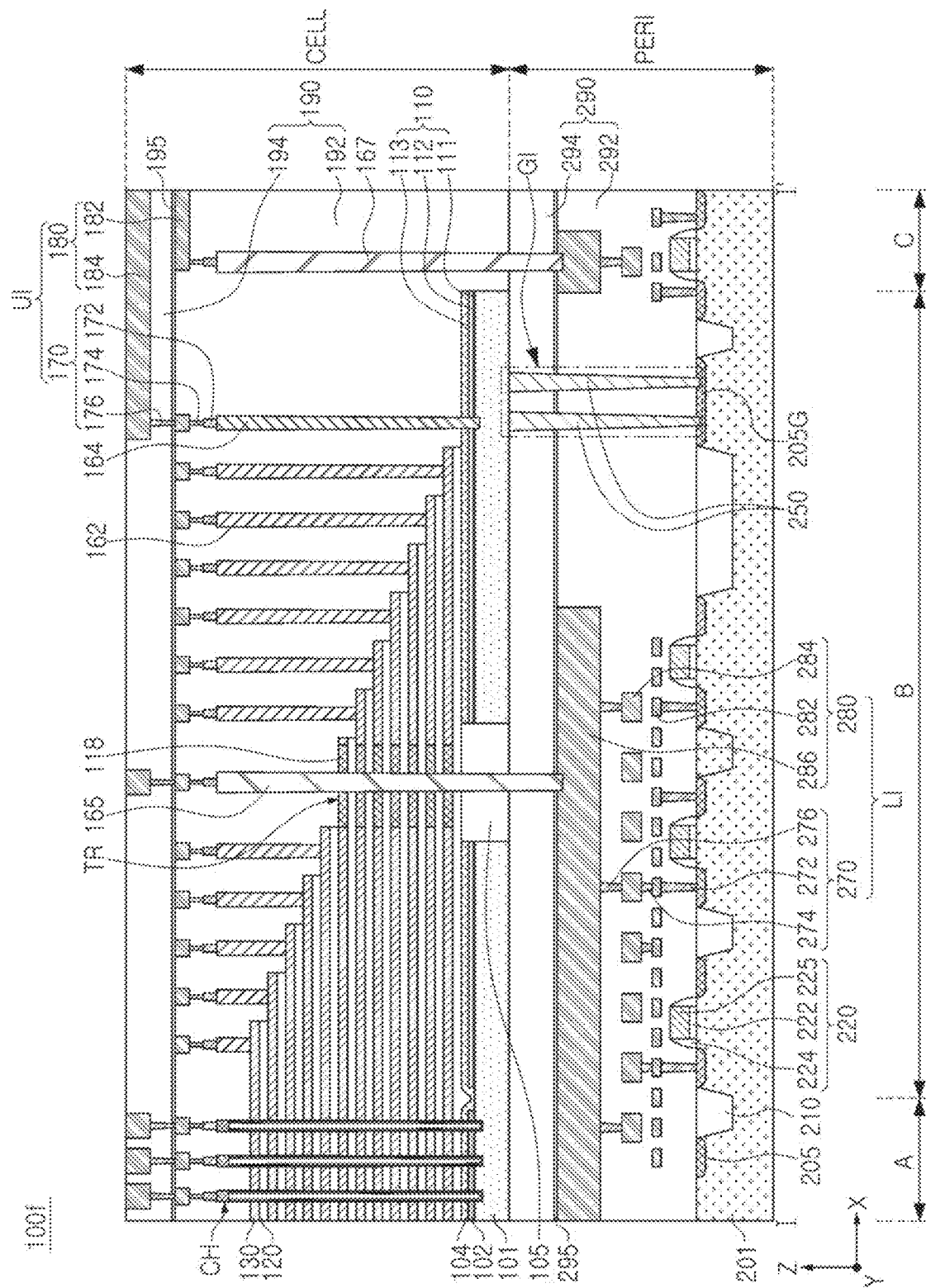
FIG. 8 is a cross-sectional view illustrating a semiconductor device according to an example embodiment of the present disclosure.

FIG. 8 is a cross-sectional view illustrating a semiconductor device according to an example embodiment.

Referring to FIG. 8, in a semiconductor device 100f, a connection structure GI may include a plurality of vias 250, two vias 250 disposed side by side in the x direction, for example. The vias 250 may be connected to a single impurity region 205G, but an example embodiment thereof is not limited thereto. Also, in example embodiments, the number of the vias 250 included in the connection structure GI may be varied. The form of the connection structure GI may also be applied to other example embodiments.

Figure 9:
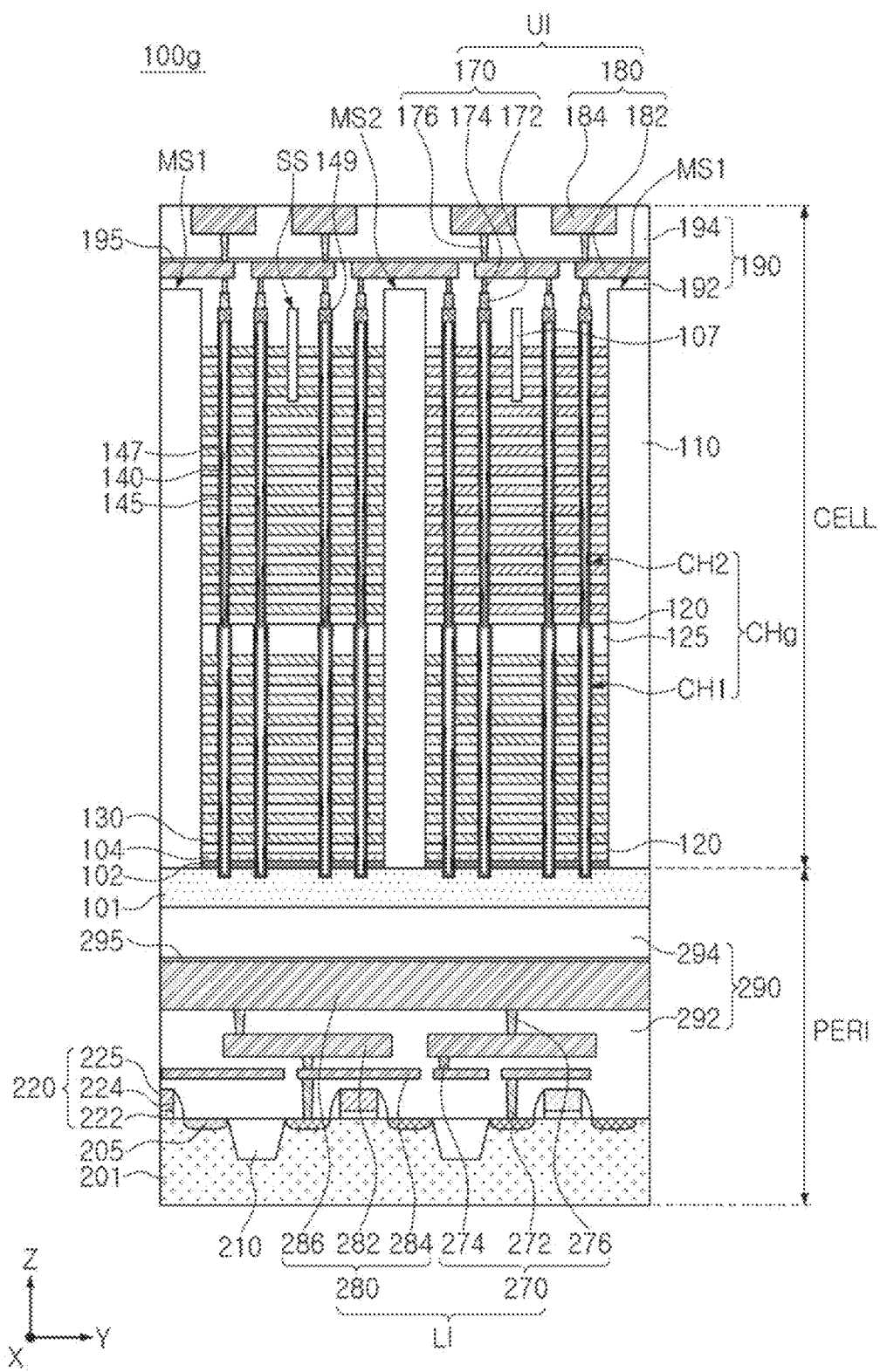
FIG. 9 is a cross-sectional view illustrating a semiconductor device according to an example embodiment of the present disclosure.

FIG. 9 is a cross-sectional view illustrating a semiconductor device according to an example embodiment.

Referring to FIG. 9, a semiconductor device 100g may include lower and upper stack structures in which stack structures of gate electrodes 130 are vertically stacked, and first and second channel structures CH1 and CH2 in which channel structures CHg are vertically stacked. The structure of the channel structures CHg may be provided to stably form the channel structures CHg when the number of the stacked gate electrodes 130 is relatively large.

The channel structures CHg may have a form in which the first channel structures CH1 in a lower portion and the second channel structures CH2 in an upper portion may be connected to each other, and may have a bent portion formed by a difference in width in the connection region. The channel layer 140, the gate dielectric layer 145, and the channel filling insulating layer 147 may be connected to each other between the first channel structure CH1 and the second channel structure CH2. The channel pad 149 may be disposed only on an upper end of the upper second channel structure CH2. However, in example embodiments, each of the first channel structure CH1 and the second channel structure CH2 may include a channel pad 149, and in this case, the channel pad 149 of the first channel structure CH1 may be connected to the channel layer 140 of the second channel structure CH2. An upper interlayer insulating layer 125 having a relatively great thickness may be disposed on an uppermost portion of the lower stack structure. However, the forms of the interlayer insulating layers 120 and the upper interlayer insulating layer 125 may be varied in example embodiments.

FIGS. 10A to 10G are cross-sectional views illustrating a method of manufacturing a semiconductor device according to an example embodiment, illustrating regions corresponding to the region illustrated in FIG. 2A.

Figure 10A:
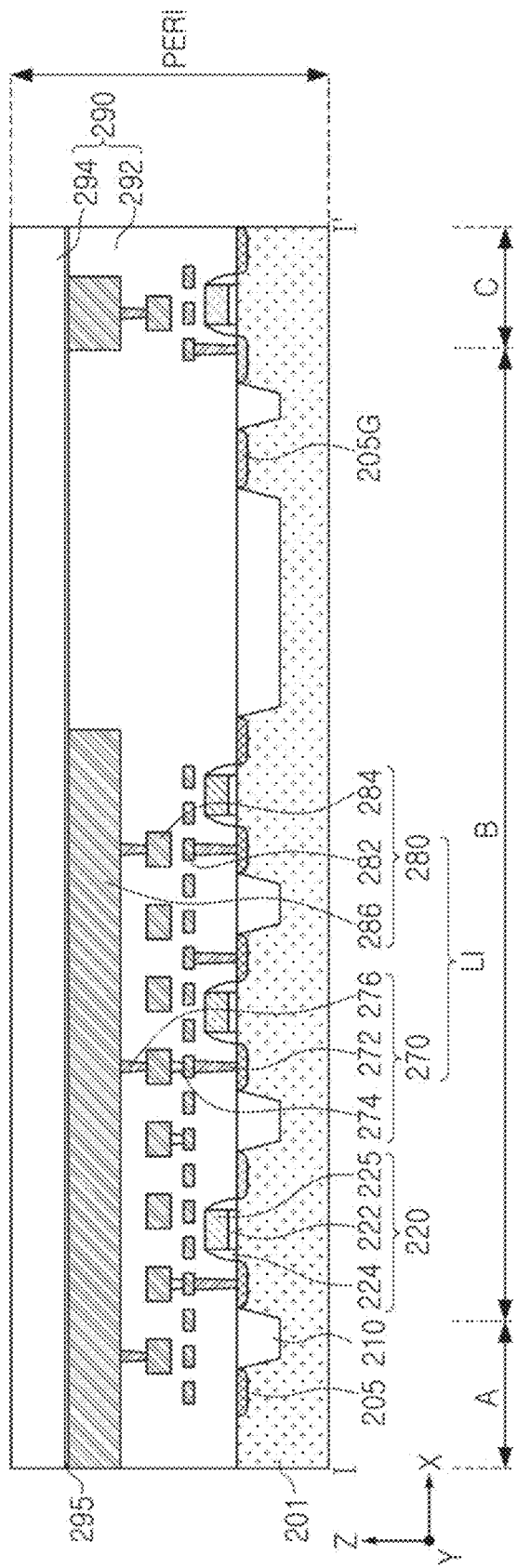
FIGS. 10A to 10G are cross-sectional views illustrating a method of manufacturing a semiconductor device according to an example embodiment of the present disclosure.

Referring to FIG. 10A, circuit devices 220 and a first interconnection structure LI forming a peripheral circuit region PERI may be formed on the first substrate 201.

Device isolation layers 210 may be formed in the first substrate 201, and a circuit gate dielectric layer 222 and a circuit gate electrode 225 may be formed in order on the first substrate 201. The device isolation layers 210 may be formed by a shallow trench isolation (STI) process, for example. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polysilicon or metal silicide layers, but an example embodiment thereof is not limited thereto. Thereafter, a spacer layer 224, source/drain regions 205, and impurity regions 205G may be formed on both sidewalls of the circuit gate dielectric layer 222 and the circuit gate electrode 225. In example embodiments, the spacer layer 224 may include a plurality of layers. Thereafter, the source/drain regions 205 and the impurity regions 205G may be formed by performing an ion implantation process. The impurity region 205G may be formed together with at least a portion of the source/drain regions 205 and may include impurities of the same concentration and the conductivity type, and may include impurities having a conductivity type different from that of the first substrate 201.

The lower contact plugs 270 of the first interconnection structure LI may be formed by partially forming the first peripheral region insulating layer 292, partially removing the layer by etching, and filling a conductive material. The lower interconnection lines 280 may be formed by depositing a conductive material and patterning the conductive material.

The first peripheral region insulating layer 292 may include a plurality of insulating layers. The first peripheral region insulating layer 292 may be partially formed in each process of forming the first interconnection structure LI. A lower protective layer 295 covering an upper surface of the third lower interconnection line 286 may be formed on the first peripheral region insulating layer 292. A second peripheral region insulating layer 294 may be formed on the lower protective layer 295. Accordingly, the entire peripheral circuit regions PERI may be formed.

In the example embodiments in FIGS. 5A and 5B and the example embodiment in FIG. 7, when the first interconnection structure LI is formed, a ground interconnection structure forming a portion of the connection structure GI may also be formed. In the example embodiments in FIGS. 6A to 7, the vias 250c and 250e may be formed after at least a portion of the first peripheral region insulating layer 292 is formed.

Figure 10B:
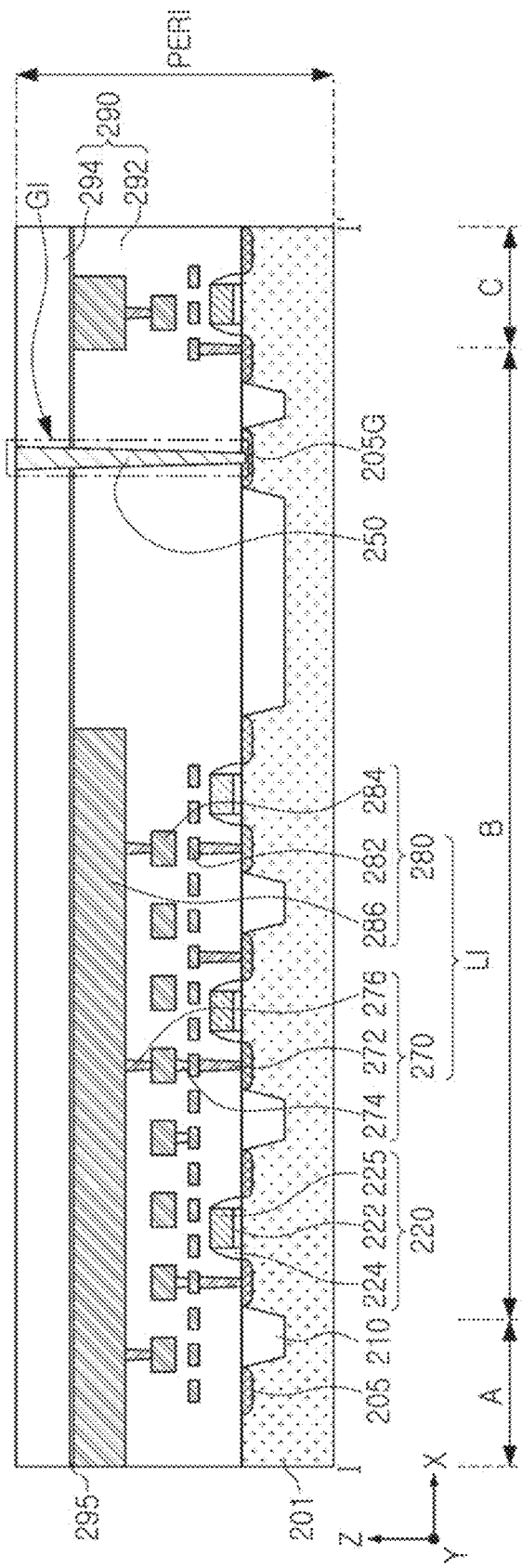

Referring to FIG. 10B, a via 250 extending from an upper surface of the second peripheral region insulating layer 294 to the impurity region 205G of the first substrate 201 may be formed.

The via 250 may be formed by forming a via hole penetrating the peripheral insulating layer 290 and the lower protective layer 295 and filling the via hole with a semiconductor material. In example embodiments, when the via hole is formed, the lower protective layer 295 may function as an etch stop layer. The via hole may be formed to be partially recessed into the impurity region 205G, but an example embodiment thereof is not limited thereto. For example, the via hole may be formed such that the upper surface of the impurity region 205G may be exposed. The via 250 may be formed of, for example, polycrystalline silicon doped with second conductivity type impurities different from the first conductivity type of the impurity region 205G and the second substrate 101 subsequently formed. The semiconductor material may be doped in-situ, or may be doped through an ion implantation process after deposition.

Accordingly, a connection structure GI may be formed. In the example embodiments in which the connection structure GI may include components other than the via 250, a region of the connection structure GI extending from the upper surface of the second peripheral region insulating layer 294 may be formed in this process.

Figure 10C:
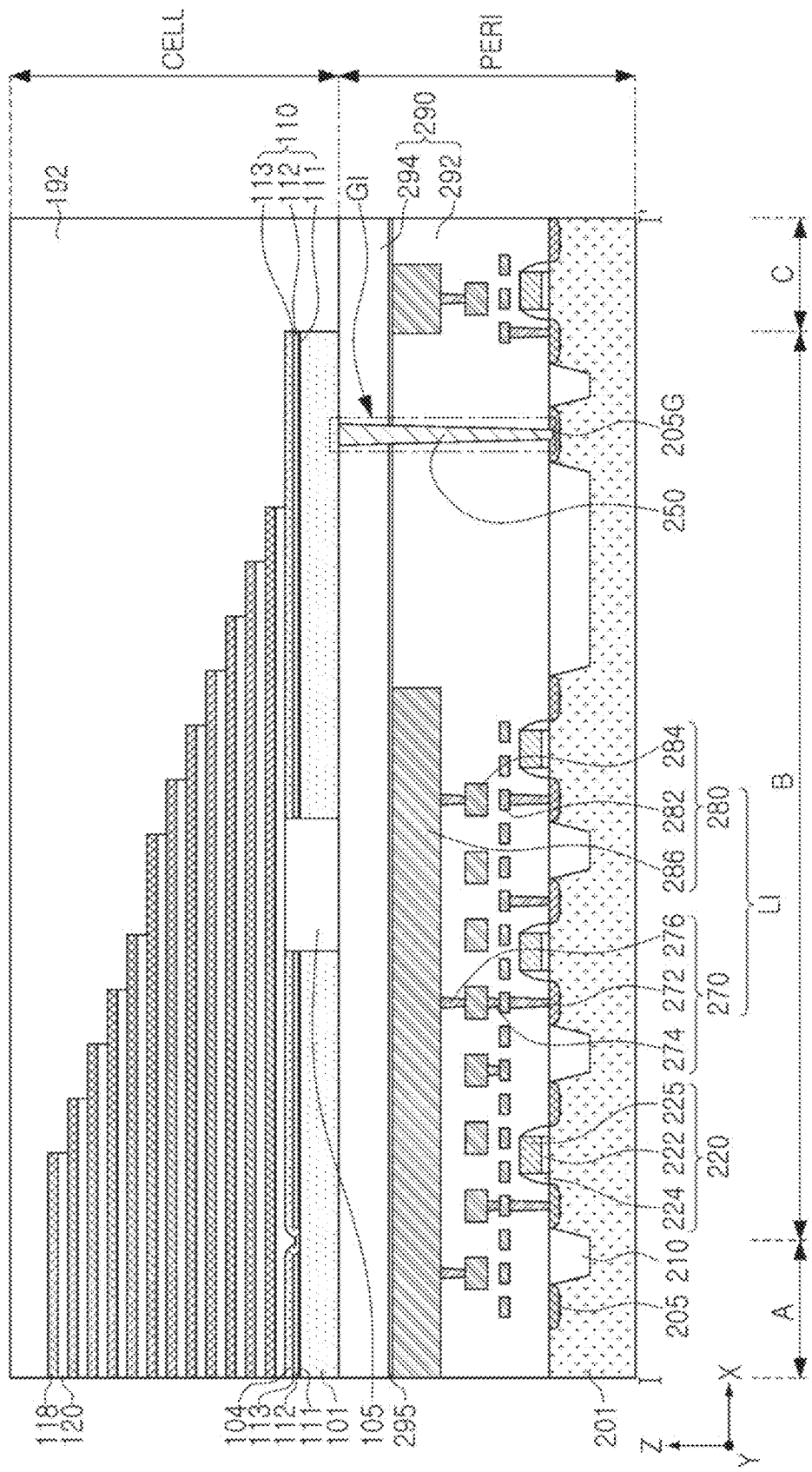

Referring to FIG. 10C, a second substrate 101 of a memory cell region CELL, first to third horizontal sacrificial layers 111, 112, and 113, a second horizontal conductive layer 104, and a substrate insulating layer 105 may be formed in an upper portion of the peripheral circuit region PERI, and the sacrificial insulating layers 118 and the interlayer insulating layers 120 may be alternately stacked.

The second substrate 101 may be formed of, for example, polycrystalline silicon, and may be formed by a CVD process. Polycrystalline silicon forming the second substrate 101 may include impurities, such as N-type impurities, for example. The second substrate 101 may be formed to be in contact with the via 250 and may be formed on the entire second peripheral region insulating layer 294 and may be patterned.

The first to third horizontal sacrificial layers 111, 112, and 113 may be stacked in order on the second substrate 101. The first to third horizontal sacrificial layers 111, 112, and 113 may be replaced with the first horizontal conductive layer 102 in FIG. 2A formed through a subsequent process in the first region A. The second horizontal conductive layer 104 may be formed on the third horizontal sacrificial layer 113.

The substrate insulating layer 105 may be formed by partially removing the second horizontal conductive layer 104, the first to third horizontal sacrificial layers 111, 112, and 113, and the second substrate 101 from an upper portion and filling an insulating material. In this process, the second substrate 101, the first to third horizontal sacrificial layers 111, 112 and 113, and the second horizontal conductive layer 104 may be patterned such that a portion of the first cell region insulating layer 192 may be formed in the third region C of the memory cell region CELL. In example embodiments, the process of patterning the second substrate 101 may be performed in another process.

The sacrificial insulating layers 118 may be partially replaced with the gate electrodes 130 (see FIG. 2A) through a subsequent process. The sacrificial insulating layers 118 may be formed of a material different from that of the interlayer insulating layers 120, and may be formed of a material etched with etch selectivity for the interlayer insulating layers 120 under desired and/or alternatively predetermined etching conditions. For example, the interlayer insulating layer 120 may be formed of at least one of silicon oxide and silicon nitride, and the sacrificial insulating layers 118 may be formed of a material different from that of the interlayer insulating layer 120, selected from among silicon, silicon oxide, silicon carbide, and silicon nitride. In example embodiments, overall thicknesses of the interlayer insulating layers 120 may not be the same. The thicknesses of the interlayer insulating layers 120 and the sacrificial insulating layers 118 and the number of films forming the layers may be varied.

A photolithography process and an etching process may be repeatedly performed on the sacrificial insulating layers 118 using a mask layer such that the sacrificial insulating layers 118 in an upper portion may extend less than the sacrificial insulating layers 118 in a lower portion. Accordingly, the sacrificial insulating layers 118 may form a stepped structure in a staircase shape by a desired and/or alternatively predetermined unit.

Thereafter, a first cell region insulating layer 192 may be formed to cover the stack structure of the sacrificial insulating layers 118 and the interlayer insulating layers 120.

Figure 10D:
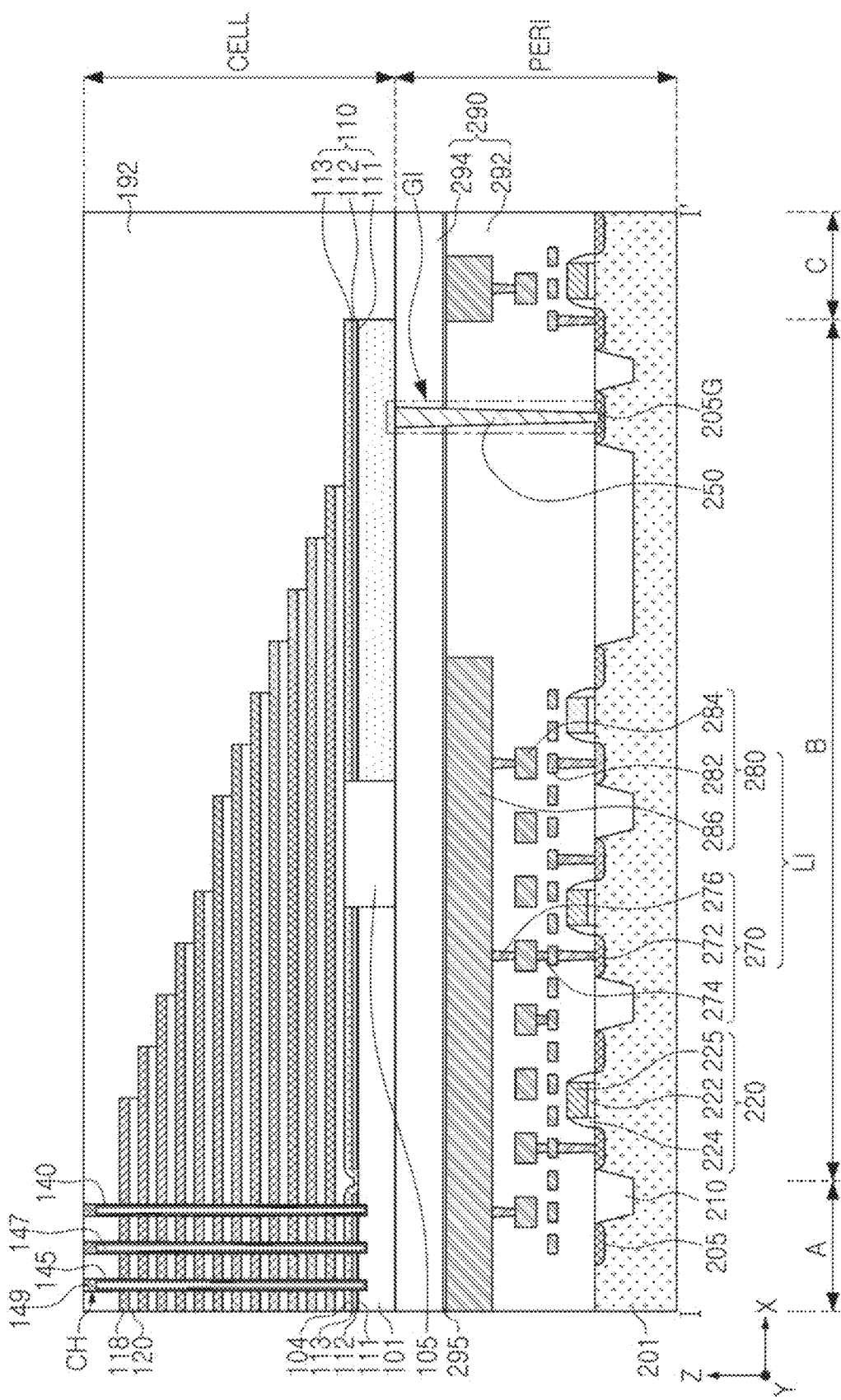

Referring to FIG. 10D, channel structures CH penetrating the stack structure of the sacrificial insulating layers 118 and the interlayer insulating layers 120 may be formed.

Upper isolation regions SS may be formed by partially removing the sacrificial insulating layers 118 and the interlayer insulating layers 120 (see FIG. 2B). The upper isolation regions SS may be formed by exposing regions in which the upper isolation regions SS are formed using a mask layer, removing a desired and/or alternatively predetermined number of the sacrificial insulating layers 118 and the interlayer insulating layers 120 from an uppermost portion, and depositing an insulating material.

The channel structures CH may be formed by anisotropically etching the sacrificial insulating layers 118 and the interlayer insulating layers 120 using a mask layer, and may be formed by forming hole-shaped channel holes and filling the channel holes. When the channel holes is formed using a plasma dry etching process, a potential difference may occur in the upper and lower portions of the channel holes due to ions generated in the channel holes. However, since the second horizontal conductive layer 104 and the second substrate 101 are connected to the first substrate 201 by the connection structure GI, positive charges may flow to the first substrate 201, for example, and negative charges moved through the mask layer may flow from an edge of a wafer to the first substrate 201, such that an arcing defect caused by a potential difference may be limited and/or prevented.

Due to a height of the stack structure, sidewalls of the channel structures CH may not be perpendicular to an upper surface of the second substrate 101. The channel structures CH may be formed to be partially recessed into the second substrate 101. Thereafter, at least a portion of the gate dielectric layer 145, the channel layer 140, the channel filling insulating layer 147, and the channel pad 149 may be formed in order in the channel structures CH.

The gate dielectric layer 145 may be formed to have a uniform thickness using an ALD or CVD process. In this process, the gate dielectric layer 145 may be entirely or partially formed, and a portion extending perpendicularly to the second substrate 101 along the channel structures CH may be formed in this process. The channel layer 140 may be formed on the gate dielectric layer 145 in the channel structures CH. The channel filling insulating layer 147 may be formed to fill the channel structures CH, and may be an insulating material. The channel pad 149 may be formed of a conductive material, such as polycrystalline silicon, for example.

Figure 10E:
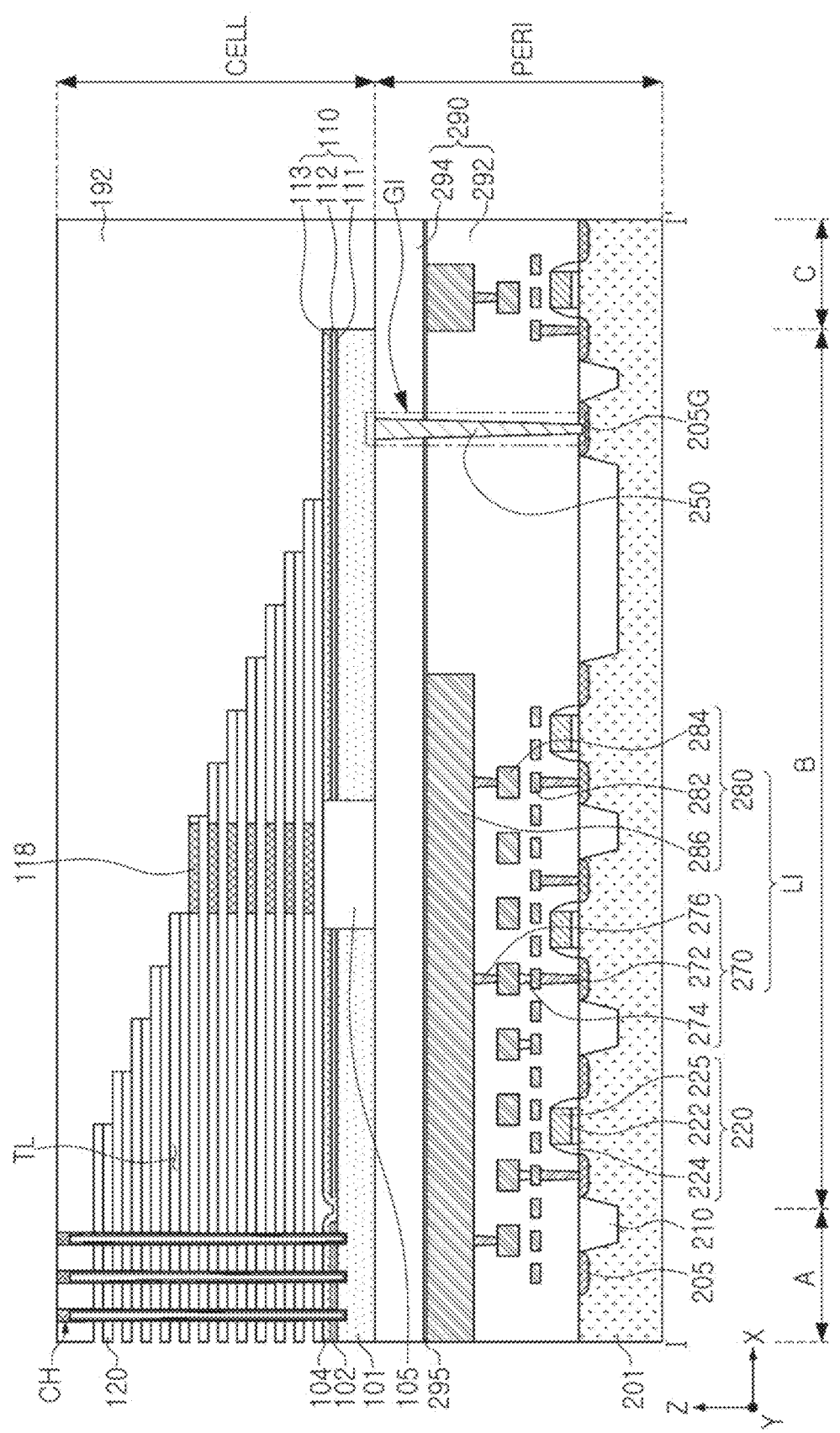

Referring to FIG. 10E, tunnel portions TL may be formed in regions corresponding to the first and second isolation regions MS1 and MS2 (see FIG. 1) by forming openings penetrating the stack structure of the sacrificial insulating layers 118 and the interlayer insulating layers 120, and partially removing the sacrificial insulating layers 118 through the openings.

The openings may be formed to penetrate the stack structure of the sacrificial insulating layers 118 and the interlayer insulating layers 120 and to penetrate the second horizontal conductive layer 104 in a lower portion. Thereafter, the second horizontal sacrificial layer 112 may be exposed through an etch-back process while forming sacrificial spacer layers in the openings. The second horizontal sacrificial layer 112 may be selectively removed from the region exposed in the first region A, and the upper and lower first and third horizontal sacrificial layers 111 and 113 may be removed.

The first to third horizontal sacrificial layers 111, 112, and 113 may be removed by, for example, a wet etching process. During the process of removing the first and third horizontal sacrificial layers 111 and 113, the exposed gate dielectric layer 145 may also be partially removed from the region from which the second horizontal sacrificial layer 112 is removed. The first horizontal conductive layer 102 may be formed by depositing a conductive material in the region from which the first to third horizontal sacrificial layers 111, 112, and 113 are removed, and the sacrificial spacer layers may be removed from the openings. By this process, the first horizontal conductive layer 102 may be formed in the first region A, and the first to third horizontal sacrificial layers 111, 112, and 113 may remain in the second region B.

Thereafter, the sacrificial insulating layers 118 may be removed from an external side of the through wiring region TR (see FIG. 2A). The sacrificial insulating layers 118 may remain in the through wiring region TR and may form an insulating region of the through wiring region TR together with the interlayer insulating layers 120. The sacrificial insulating layers 118 may be selectively removed with respect to the interlayer insulating layers 120 using, for example, wet etching. Accordingly, a plurality of tunnel portions TL may be formed between the interlayer insulating layers 120.

A region in which the through wiring region TR is formed may be spaced apart from the openings, such that an etchant may not reach the region, and accordingly, the sacrificial insulating layers 118 may remain in the region. Accordingly, the through wiring region TR may be formed in a center of the first and second isolation regions MS1 and MS2 between the adjacent first and second isolation regions MS1 and MS2.

Figure 10F:
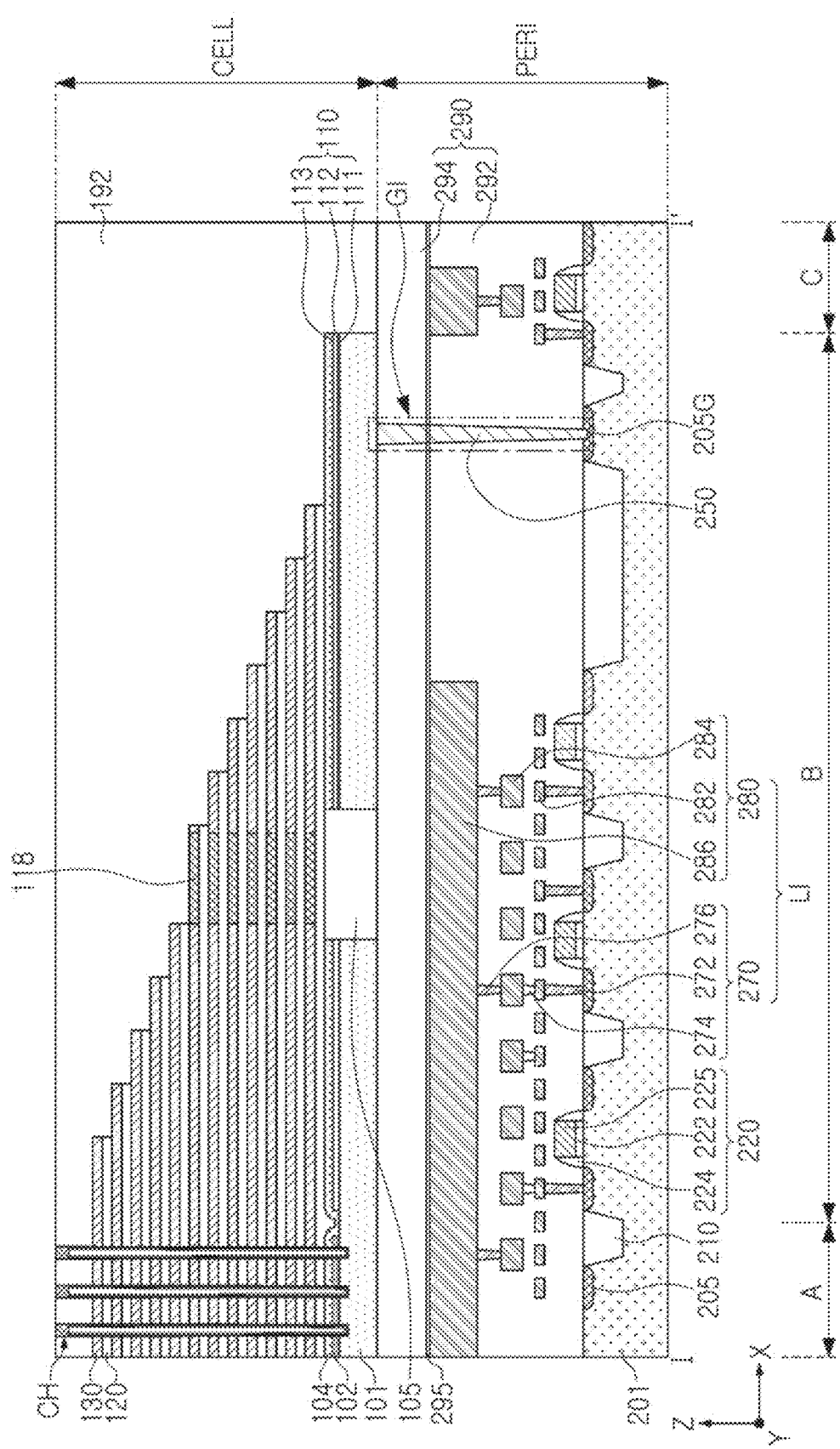

Referring to FIG. 10F, the gate electrodes 130 may be formed by filling the tunnel portions TL from which the sacrificial insulating layers 118 are partially removed with a conductive material.

The conductive material forming the gate electrodes 130 may fill the tunnel portions TL. Side surfaces of the gate electrodes 130 may be in contact with side surfaces of the sacrificial insulating layers 118 of the through wiring region TR. The conductive material may include a metal, polycrystalline silicon, or metal silicide material. After the gate electrodes 130 are formed, the conductive material deposited in the openings may be removed through an additional process, and an insulating material may be filled therein, thereby forming the isolation insulating layer 110 (see FIG. 2B).

Figure 10G:
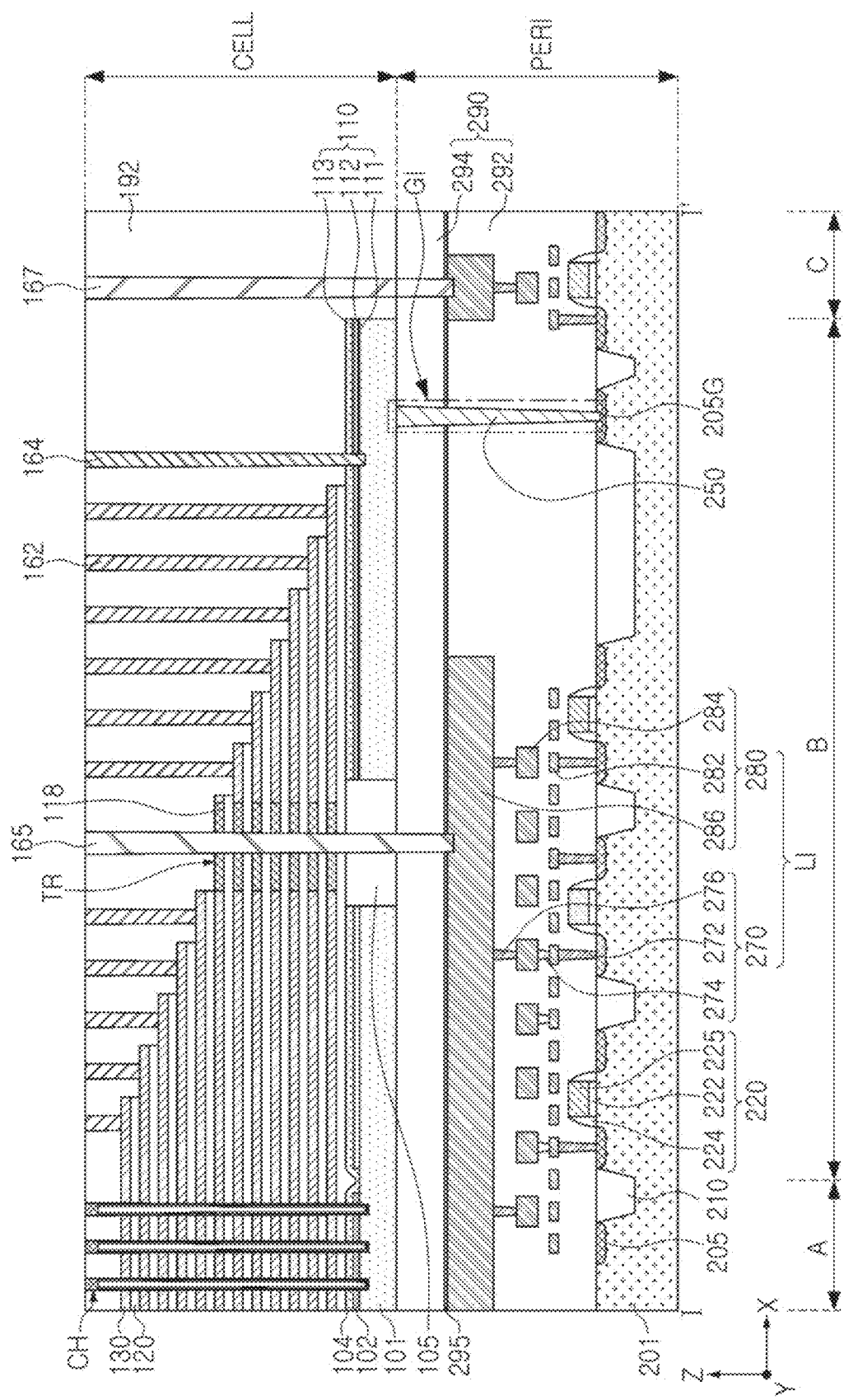

Referring to FIG. 10G, gate contacts 162, a substrate contact 164, and first and second through vias 165 and 167 penetrating the first cell region insulating layer 192 may be formed.

The gate contacts 162 may be formed to be connected to the gate electrodes 130 in the second region B, and the substrate contact 164 may be formed to be connected to the second substrate 101 on the end of the second region B. The first through via 165 may be formed to be connected to the first interconnection structure LI of the peripheral circuit region PERI in the through wiring region TR, and the second through via 167 may be formed to be connected to the first interconnection structure LI of the peripheral circuit region PERI in the third region C.

The gate contacts 162, the substrate contact 164, and the first and second through vias 165 and 167 may be formed to have different depths, and may be formed by simultaneously forming contact holes using an etch stop layer and filling the contact holes with a conductive material. However, in example embodiments, a portion of the gate contacts 162, the substrate contact 164, and the first and second through vias 165 and 167 may be formed in different processes.

Thereafter, referring back to FIG. 2A, a second cell region insulating layer 194, an upper protective layer 195, and an upper interconnection structure UI may be formed.

Upper contact plugs 170 of the upper interconnection structure UI may be formed by partially forming the cell region insulating layer 290, partially removing the layer by etching, and filling a conductive material. The upper interconnection lines 180 may be formed by depositing a conductive material and patterning the conductive material, for example.

Accordingly, the semiconductor device 100 in FIGS. 1 to 3 may be manufactured.

Figure 11:
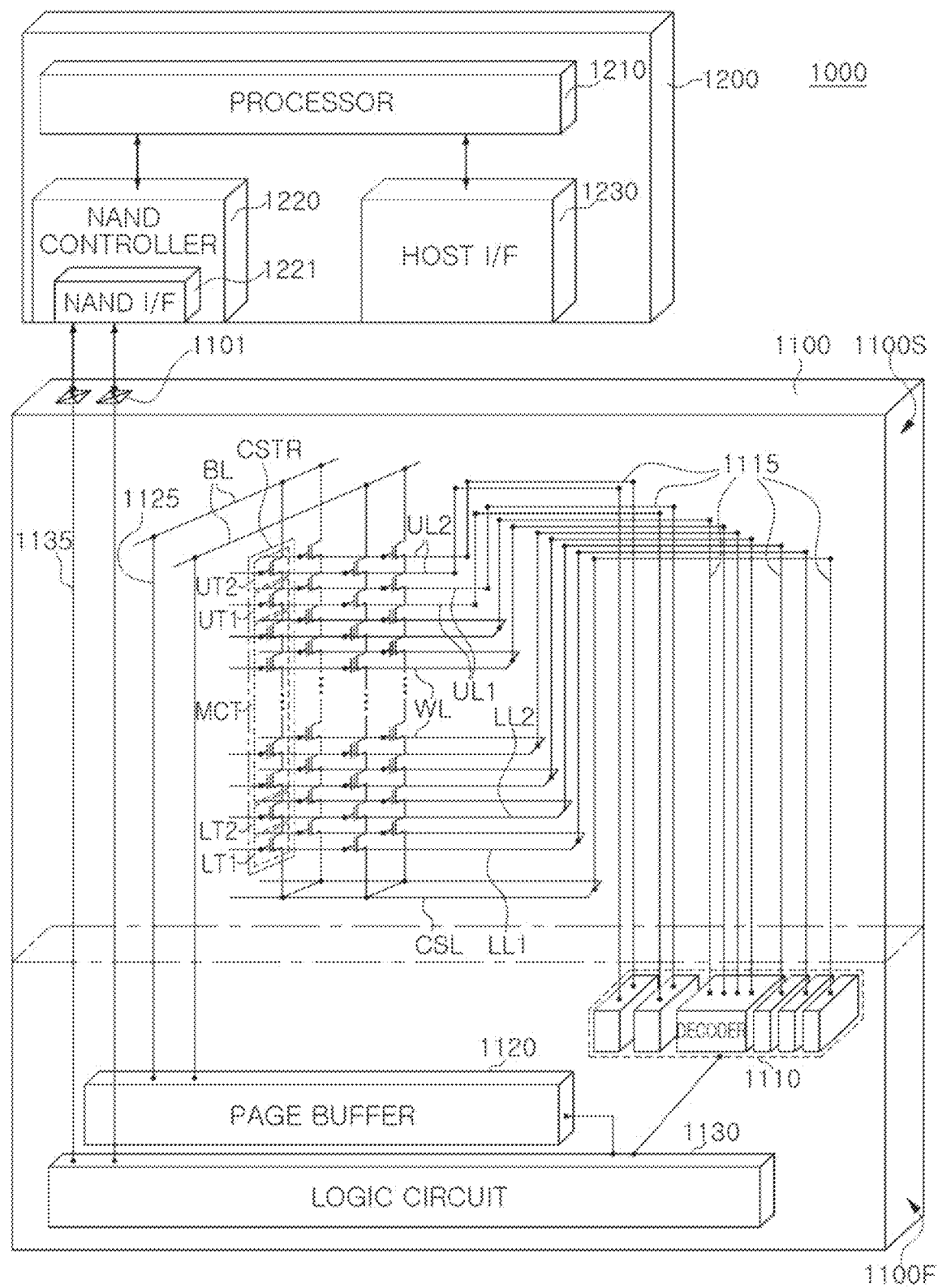
FIG. 11 is a view illustrating a data storage system including a semiconductor device according to an example embodiment of the present disclosure.

FIG. 11 is a view illustrating a data storage system including a semiconductor device according to an example embodiment.

Referring to FIG. 11, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) device, a universal serial bus (USB), a computing system, a medical device, or a communication device, including one or a plurality of semiconductor devices 1100.

The semiconductor device 1100 may be implemented as a nonvolatile memory device, and may be implemented as the NAND flash memory device described with reference to FIGS. 1 to 9, for example. The semiconductor device 1100 may include a first semiconductor structure 1100F and a second semiconductor structure 1100S on the first semiconductor structure 1100F. In example embodiments, the first semiconductor structure 1100F may be disposed on the side of the second semiconductor structure 1100S. The first semiconductor structure 1100F may be configured as a peripheral circuit structure including a decoder circuit 1110, a page buffer 1120, and a logic circuit 1130. The second semiconductor structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the semiconductor structure 1100F to the second semiconductor structure 1100S. The bit lines BL may be electrically connected to the page buffer 1120 through second connection wirings 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through an input and output pad 1101 electrically connected to the logic circuit 1130. The input and output pad 1101 may be electrically connected to the logic circuit 1130 through an input and output connection wiring 1135 extending from the first semiconductor structure 1100F to the second semiconductor structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a desired and/or alternatively predetermined firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 12:
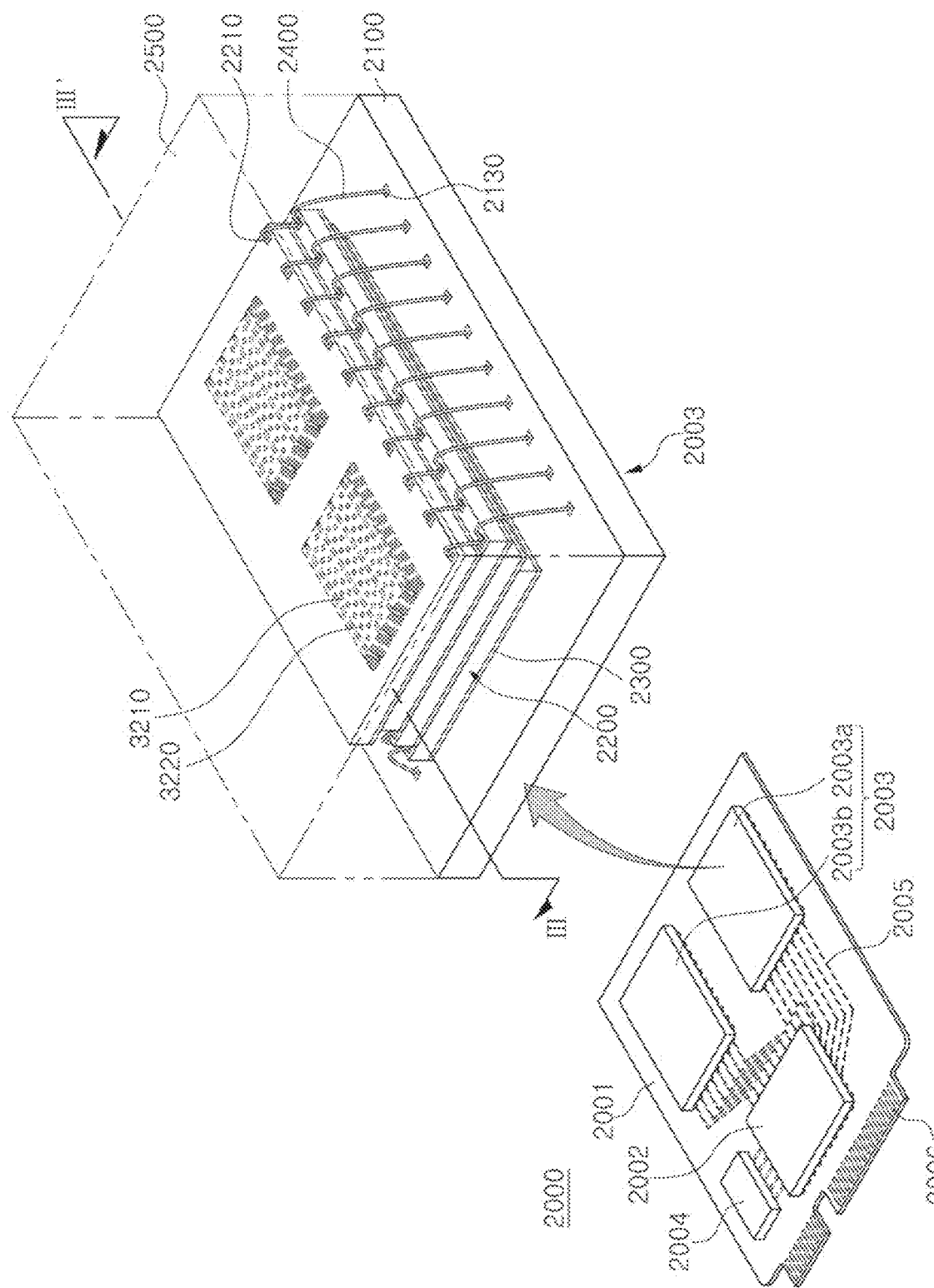
FIG. 12 is a perspective view illustrating a data storage system including a semiconductor device according to an example embodiment of the present disclosure.

FIG. 12 is a perspective view illustrating a data storage system including a semiconductor device according to an example embodiment.

Referring to FIG. 12, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In example embodiments, the data storage system 2000 may communication with the external host through one of a universal serial bus (USB), a peripheral component interconnect express (PCI-Express), a serial advanced technology attachment (SATA), and an M-phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130. Each of the semiconductor chips 2200 may include an input and output pad 2210. The input and output pad 2210 may correspond to the input and output pad 1101 in FIG. 11. Each of the semiconductor chips 2200 may include gate stack structures 3210 and channel structures 3220. Each of the semiconductor chips 2200 may include the semiconductor device described with reference to FIGS. 1 to 9.

In example embodiments, the connection structure 2400 may be a bonding wire electrically connecting the input and output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by wirings formed on the interposer substrate.

Figure 13:
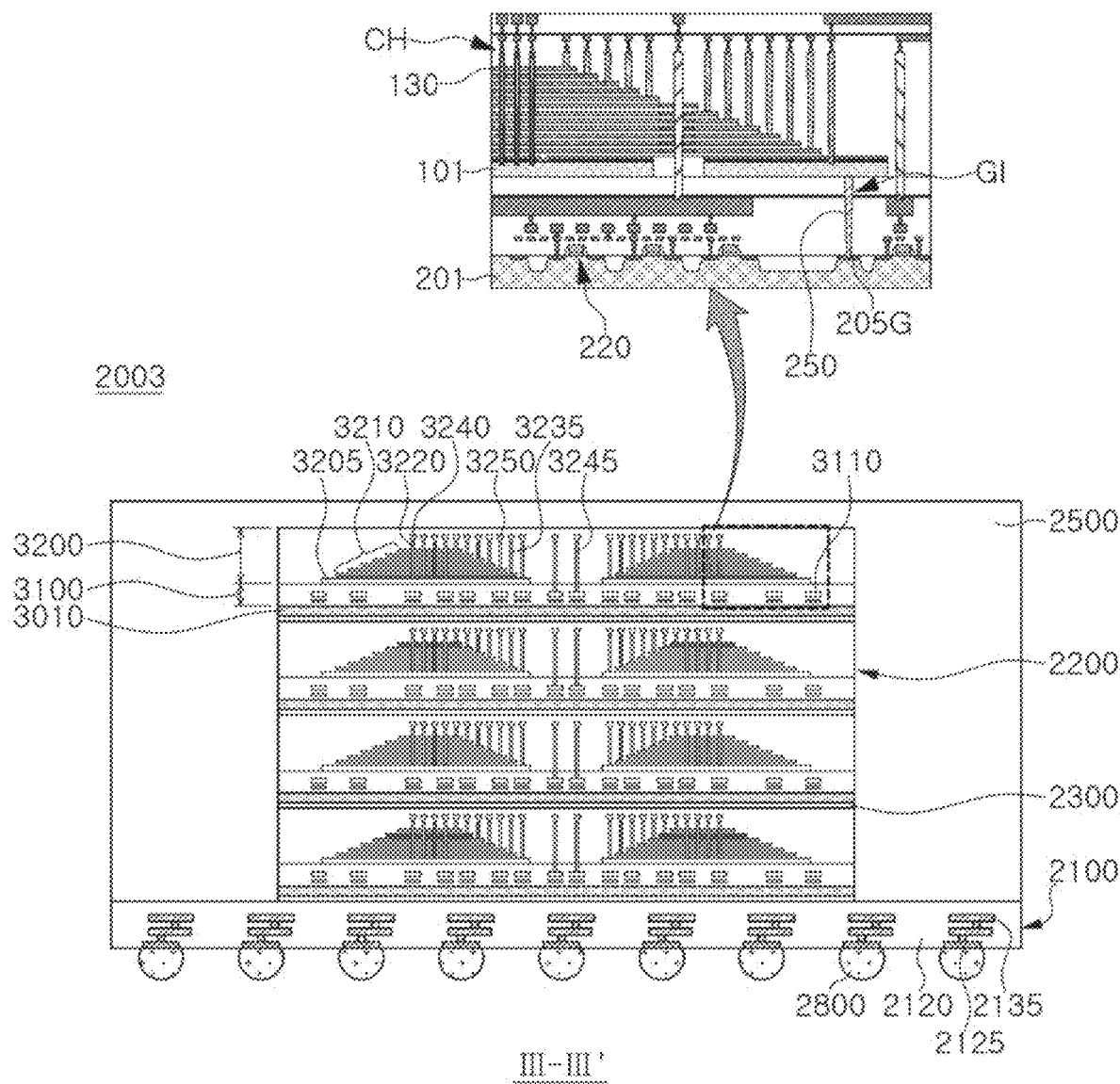
FIG. 13 is a cross-sectional view illustrating a semiconductor package according to an example embodiment of the present disclosure.

FIG. 13 is a cross-sectional view illustrating a semiconductor package according to an example embodiment. FIG. 13 illustrates an example embodiment of the semiconductor package 2003 in FIG. 12, and illustrates the semiconductor package 2003 in FIG. 12 taken along line III-III'.

Referring to FIG. 13, in the semiconductor package 2003, the package substrate 2100 may be configured as a printed circuit board. The package substrate 2100 may include a package substrate body portion 2120, package upper pads 2130 (see FIG. 12) disposed on an upper surface of the package substrate body portion 2120, lower pads 2125 disposed on a lower surface of the package substrate body portion 2120 or exposed through the lower surface, and internal wirings 2135 electrically connecting the upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2010 of the data storage system 2000 through conductive connection portions 2800.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 and isolation structures 3230 penetrating the gate stack structure 3210, bit lines 3240 electrically connected to the memory channel structures 3220, and contact plugs 3235 electrically connected to the word lines WL (see FIG. 11) of the gate stack structure 3210. As described with reference to FIGS. 1 to 9, in each of the semiconductor chips 2200, the via 250 of the connection structure GI may be disposed such that the second substrate 101, the via 250, an impurity region 205G, and the first substrate 201 may form NPNP junction.

Each of the semiconductor chips 2200 may include a through wiring 3245 electrically connected to the peripheral wirings 3110 of the first structure 3100 and extending into the second semiconductor structure 3200. The through wiring 3245 may be disposed on an external side of the gate stack structure 3210, and may be further disposed to penetrate the gate stack structure 3210. Each of the semiconductor chips 2200 may further include an input and output pad 2210 (see FIG. 12) electrically connected to the peripheral wirings 3110 of the first structure 3100.

According to the aforementioned example embodiments, by improving and/or optimizing the junction structure between the via connecting the first substrate to the second substrate and the peripheral components, a semiconductor device having improved reliability and/or a data storage system including the same may be provided.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
a first semiconductor structure including a first substrate, circuit devices on the first substrate, a lower interconnection structure electrically connected to the circuit devices, and a connection structure,
the first substrate including an impurity region including impurities of a first conductivity type,
the connection structure including a via including a semiconductor of a second conductivity type; and
a second semiconductor structure including a second substrate on the first semiconductor structure, gate electrodes stacked and spaced apart from each other in a first direction perpendicular to an upper surface of the second substrate, and channel structures penetrating the gate electrodes,
the second substrate including a semiconductor of the first conductivity type,
the channel structures extending perpendicular to the second substrate, and
the channel structures each including a channel layer, and
the second semiconductor structure being connected to the impurity region of the first substrate through the connection structure.

2. The semiconductor device of claim 1, wherein
the first conductivity type is n-type, and
the second conductivity type is p-type.

3. The semiconductor device of claim 1, wherein
the second substrate includes first impurities of the first conductivity type in a first concentration,
the via includes second impurities of the second conductivity type in a second concentration, and
the first concentration is higher than the second concentration.

4. The semiconductor device of claim 1, wherein
the via includes second impurities of the second conductivity type in a second concentration, and
the second concentration is in a range of about $7.5\times10^{16}$ to about $2.5\times10^{17}$.

5. The semiconductor device of claim 1,
wherein the first semiconductor structure further includes a peripheral region insulating layer covering the circuit devices, and
wherein the via penetrates the peripheral region insulating layer and directly connects the first substrate to the second substrate.

6. The semiconductor device of claim 5, wherein an upper surface of the via is in contact with a lower surface of the second substrate.

7. The semiconductor device of claim 1, wherein
the connection structure further includes a ground interconnection structure below the via, the ground interconnection structure having a structure corresponding to the lower interconnection structure.

8. The semiconductor device of claim 7, wherein
the first semiconductor structure includes an insulating layer on the first substrate,
the insulating layer defines a via hole,
the via includes a barrier layer and a semiconductor layer,
the barrier layer covers a bottom surface of the via hole,
the semiconductor layer is on the barrier layer,
the semiconductor layer fills the via hole, and
the semiconductor layer has the second conductivity type.

9. The semiconductor device of claim 7, wherein the ground interconnection structure includes a metal material.

10. The semiconductor device of claim 1, wherein the connection structure further includes an upper contact plug on the via.

11. The semiconductor device of claim 10, wherein the upper contact plug includes a semiconductor layer having the first conductive type.

12. The semiconductor device of claim 10, wherein
the upper contact plug is integrated with the second substrate, and
the upper contact plug includes a same material as a material of the second substrate.

13. The semiconductor device of claim 1, wherein
the via in the connection structure is one of a plurality of vias disposed side by side with each other.

14. A semiconductor device, comprising:
a first substrate including an impurity region;
circuit devices on the first substrate;
a lower interconnection structure electrically connected to the circuit devices;
a second substrate on the lower interconnection structure, the second substrate including a semiconductor of a first conductivity type;
gate electrodes on the second substrate and stacked and spaced apart from each other in a direction perpendicular to an upper surface of the second substrate;
channel structures penetrating the gate electrodes, the channel structures extending perpendicular to the second substrate, and the channel structures each including a channel layer; and
a connection structure connecting the impurity region of the first substrate to the second substrate, the connection structure including a via, the via including a semiconductor of a second conductivity type that is different from the first conductivity type.

15. The semiconductor device of claim 14, wherein
the first conductivity type is n-type, and
the second conductivity type is p-type.

16. The semiconductor device of claim 14, wherein
the impurity region of the first substrate includes semiconductor of the first conductivity type, and
at least a portion of the first substrate in contact with the impurity region includes a semiconductor having the second conductivity type.

17. The semiconductor device of claim 14, wherein
the second substrate includes impurities of the first conductivity type,
the via includes impurities of the second conductivity type, and
an impurity concentration of the via is lower than each of an impurity concentration of the impurity region of the first substrate and an impurity concentration of the second substrate.

18. The semiconductor device of claim 14, wherein
the connection structure further includes a contact plug connected to the via, and
the contact plug is on at least one of an upper portion of the via and a lower portion of the via.

19. A data storage system, comprising:
a semiconductor storage device,
the semiconductor storage device including a first substrate including an impurity region, circuit devices on the first substrate, a lower interconnection structure electrically connected to the circuit devices, a second substrate on the lower interconnection structure, gate electrodes on the second substrate, channel structures penetrating the gate electrodes, a connection structure connecting the impurity region of the first substrate to the second substrate, and an input and output pad electrically connected to the circuit devices,
the second substrate including a semiconductor of a first conductivity type,
the gate electrodes being stacked and spaced apart from each other in a direction perpendicular to an upper surface of the second substrate,
the channel structures extending perpendicular to the second substrate,
the channel structures each including a channel layer,
the connection structure including a via, and
the via including a semiconductor of a second conductivity type that is different than a conductivity type of the second substrate; and
a controller electrically connected to the semiconductor storage device through the input and output pad and configured to control the semiconductor storage device.

20. The data storage system of claim 19, wherein the impurity region of the first substrate includes impurities of the first conductivity type.

* * * * *